United States Patent
Ooishi et al.

[11] Patent Number: 6,067,260
[45] Date of Patent: May 23, 2000

[54] SYNCHRONOUS SEMICONDUCTOR MEMORY DEVICE HAVING REDUNDANT CIRCUIT OF HIGH REPAIR EFFICIENCY AND ALLOWING HIGH SPEED ACCESS

[75] Inventors: Tsukasa Ooishi; Shigeki Tomishima; Hiroki Shimano, all of Hyogo, Japan

[73] Assignee: Mitsubishi Denki Kabushiki Kaisha, Tokyo, Japan

[21] Appl. No.: 09/195,194

[22] Filed: Nov. 18, 1998

[30] Foreign Application Priority Data

Jun. 22, 1998 [JP] Japan .................................. 10-175000

[51] Int. Cl.⁷ .............................. G11C 7/00; G11C 8/00
[52] U.S. Cl. ...................................... 365/200; 365/230.03
[58] Field of Search ................................... 365/200, 201, 365/230.03, 207, 231

[56] References Cited

U.S. PATENT DOCUMENTS

| | | | |
|---|---|---|---|
| 5,386,387 | 1/1995 | Tanizaki | 365/200 |
| 5,544,113 | 8/1996 | Kirihata et al. | 365/200 |
| 5,652,725 | 7/1997 | Suma et al. | 365/200 |
| 5,708,612 | 1/1998 | Abe | 365/200 |
| 5,761,138 | 6/1998 | Lee et al. | 365/200 |

FOREIGN PATENT DOCUMENTS 5-282894 10/1993 Japan .
6-76596 3/1994 Japan .

OTHER PUBLICATIONS

"A Flexible Redundancy Technique for High–Density DRAM's", M. Horiguchi, et al., IEEE Journal of Solid–State Circuits, vol. 26, No. 1, Jan. 1991, pp. 12–17.

"Fault–Tolerant Designs for 256 Mb DRAM", T. Kirihata, et al., IEEE Journal of Solid–State Circuits, vol. 31, No. 4, Apr. 1996, pp. 558–565.

*Primary Examiner*—David Nelms
*Assistant Examiner*—Anh Phung
*Attorney, Agent, or Firm*—McDermott, Will & Emery

[57] ABSTRACT

A redundant memory cell column region provided corresponding to respective regular memory cell column regions can have data read and written through a sub I/O line pair and a main I/O line pair independent to those of the regular memory cell column region. Also, one redundant memory cell column region can be connected to a corresponding global I/O line pair G-I/O of any of the regular memory cell column regions via a multiplexer to be replaceable of any of two regular memory cell column regions.

12 Claims, 26 Drawing Sheets

SYNCHRONOUS SEMICONDUCTOR MEMORY DEVICE HAVING REDUNDANT CIRCUIT OF HIGH REPAIR EFFICIENCY AND ALLOWING HIGH SPEED ACCESS

BACKGROUND OF THE INVENTION

1. Field of the Invention

The present invention relates to synchronous semiconductor memory devices, and more particularly, to the structure of a redundant circuit in a synchronous semiconductor memory device.

2. Description of the Background Art

In order to comply with the higher operation speed of recent microprocessors (referred to as MPU hereinafter), a synchronous DRAM (referred to as SDRAM hereinafter) is used that operates in synchronization with a clock signal to realize high speed access of a dynamic random access memory (referred to as DRAM hereinafter) employed as a main storage device. Control of the internal operation of such SDRAMs is carried out with the row related operation and the column related operation separated from each other.

In order to further increase the operation speed in a SDRAM, a bank structure is employed in which the memory cell array is divided into a plurality of banks that can operate independent of each other. In other words, the row related operation and the column related operation are controlled independently for each bank.

Each of such banks is often divided into blocks called a memory cell array mat in which are provided a sense amplifier and the like to amplify data from a selected memory cell via a bit line pair.

In order to improve the fabrication yield and the like of the SDRAM having the above structure, the so-called redundancy replacement is generally carried out where a memory cell row or memory cell column including defection is replaced with a redundant row or column that is prepared in advance.

This redundancy replacement is generally carried out on the basis of the range of the memory cell array mat where the above-described operation is activated.

In this case, the range of memory cells that can be replaced with one redundant row (or one redundant column) will be limited to this memory cell array mat range. There is a problem that the area penalty is increased by incorporating any extra redundant row (column), or that the repair efficiency by redundancy replacement is reduced.

In a SDRAM that must carry out operation at high speed, there was a problem that a sufficient operational margin could not be obtained when redundancy replacement is carried out since extra time is necessary to determine whether or not to effect redundancy replacement with respect to an externally applied address signal.

There was also a problem that the operating current and power consumption during standby are increased in accordance with a larger storage capacity of the memory.

SUMMARY OF THE INVENTION

An object of the present invention is to provide a synchronous semiconductor memory device integrated in high complexity having a redundancy replace circuit of high repair efficiency and that allows increase in the chip area to be suppressed.

Another object of the present invention is to provide a synchronous semiconductor memory device that has a sufficient operational margin and that can speed up the access time even when redundancy replacement is carried out.

A further object of the present invention is to provide a synchronous semiconductor memory device that allows increase in power consumption suppressed even when redundancy replacement is carried out.

According to an aspect of the present invention, a synchronous semiconductor memory device receiving an externally applied address signal and control signal in synchronization with an external clock signal includes a memory cell array, an address bus, a plurality of first column select circuits, a plurality of second column select circuits, a plurality of first input/output line pairs, and a plurality of second input/output line pairs.

The memory cell array has a plurality of memory cells arranged in a matrix. The memory cell array includes a plurality of regular memory cell blocks, and a plurality of redundant memory cell blocks provided corresponding to every first plurality of regular memory cell blocks to replace a defective memory cell in a corresponding first plurality of regular memory cell blocks.

The address bus is provided common to the plurality of regular memory cell blocks and redundant memory cell blocks to transmit an address signal.

The plurality of first column select circuits are provided corresponding to the regular memory cell blocks to select a memory cell column in a corresponding regular memory cell block according to an address signal through the address bus. The plurality of second column select circuits are provided corresponding to the redundant memory cell blocks to select a memory cell column in a corresponding redundant memory cell block according to an address signal from the address bus.

The plurality of first input/output line pairs are provided corresponding to the regular memory cell blocks to transmit data read out from a selected memory cell of a corresponding regular memory cell block. The plurality of second input/output line pairs are provided corresponding to the redundant memory cell blocks to transmit data read out from a selected memory cell of a corresponding redundant memory cell block.

The first and second column select circuits are activated in response to selection of a corresponding memory cell block according to an address signal.

Preferably, the first input/output line pair includes a second plurality of first sub input/output line pairs, and a plurality of first main input/output line pairs. The second input/output line pair includes a second plurality of second sub input/output line pairs and a plurality of second main input/output line pairs. The synchronous semiconductor memory device includes a plurality of first subamplifier circuits, a plurality of second subamplifier circuits, a plurality of subamplifier control signal lines, and a subamplifier activation circuit.

The second plurality of first sub input/output line pairs are provided in a row direction of the memory cell array. The plurality of first main input/output line pairs are provided in a column direction of the memory cell array.

The second plurality of second sub input/output line pairs are provided in the row direction of the memory cell array. The plurality of second main input/output line pairs are provided in the column direction of the memory cell array.

The plurality of first subamplifier circuits are provided corresponding to respective crossings of a first sub input/output line pair and a first main input/output line pair. The plurality of second subamplifier circuits are provided corresponding to respective crossings of a second sub input/output line pair and a second main input/output line pair.

The plurality of subamplifier control signal lines are provided common to the first subamplifier circuit and the second subamplifier circuit in the row direction of the memory cell array to transmit a subamplifier select signal.

The subamplifier activation circuit renders the second subamplifier circuit active in response to replacement being carried out of a memory cell in the regular memory cell array block with a memory cell in a redundant memory cell block.

Alternatively, the first input/output line pair preferably includes a second plurality of first sub input/output line pairs, and a plurality of first main input/output line pairs. The second input/output line pair includes a second plurality of second sub input/output line pairs and a plurality of second main input/output line pairs. The synchronous semiconductor memory device includes a plurality of first main amplifier circuits, a plurality of second main amplifier circuits, a data bus, and a multiplexer circuit.

The second plurality of first sub input/output line pairs are provided in the row direction of the memory cell array. The plurality of first main input/output line pairs are provided in the column direction of the memory cell array.

The second plurality of second sub input/output line pairs are provided in the row direction of the memory cell array. The plurality of second main input/output line pairs are provided in the column direction of the memory cell array.

The plurality of first main amplifier circuits are provided corresponding to the plurality of first main input/output line pairs respectively. The plurality of second main amplifier circuits are provided corresponding to the plurality of second main input/output line pairs respectively.

The data bus is provided common to the plurality of regular memory cell blocks and redundant memory cell blocks to transmit read out data. The data bus includes a plurality of data line pairs.

The multiplexer circuit is provided corresponding to a redundant memory cell block to selectively transmit the output of the second main amplifier circuit to any of the plurality of data line pairs through which the data read out from a first plurality of regular memory cell blocks replaceable by a corresponding redundant memory cell block is transmitted.

A main advantage of the present invention is that a sufficient operational margin can be obtained and that the access time can be speeded up even when redundancy replacement is carried out since the first and second column select circuit operate in parallel.

Another advantage of the present invention is that increase in power consumption can be suppressed even when redundancy replacement is carried out since the subamplifier operates when the redundant column is selected.

A further advantage of the present invention is that a redundant memory cell block can be replaced with any of the first plurality of regular memory cell blocks, and that the repair efficiency is high and increase in chip area can be suppressed in a synchronous semiconductor memory device integrated in high complexity.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
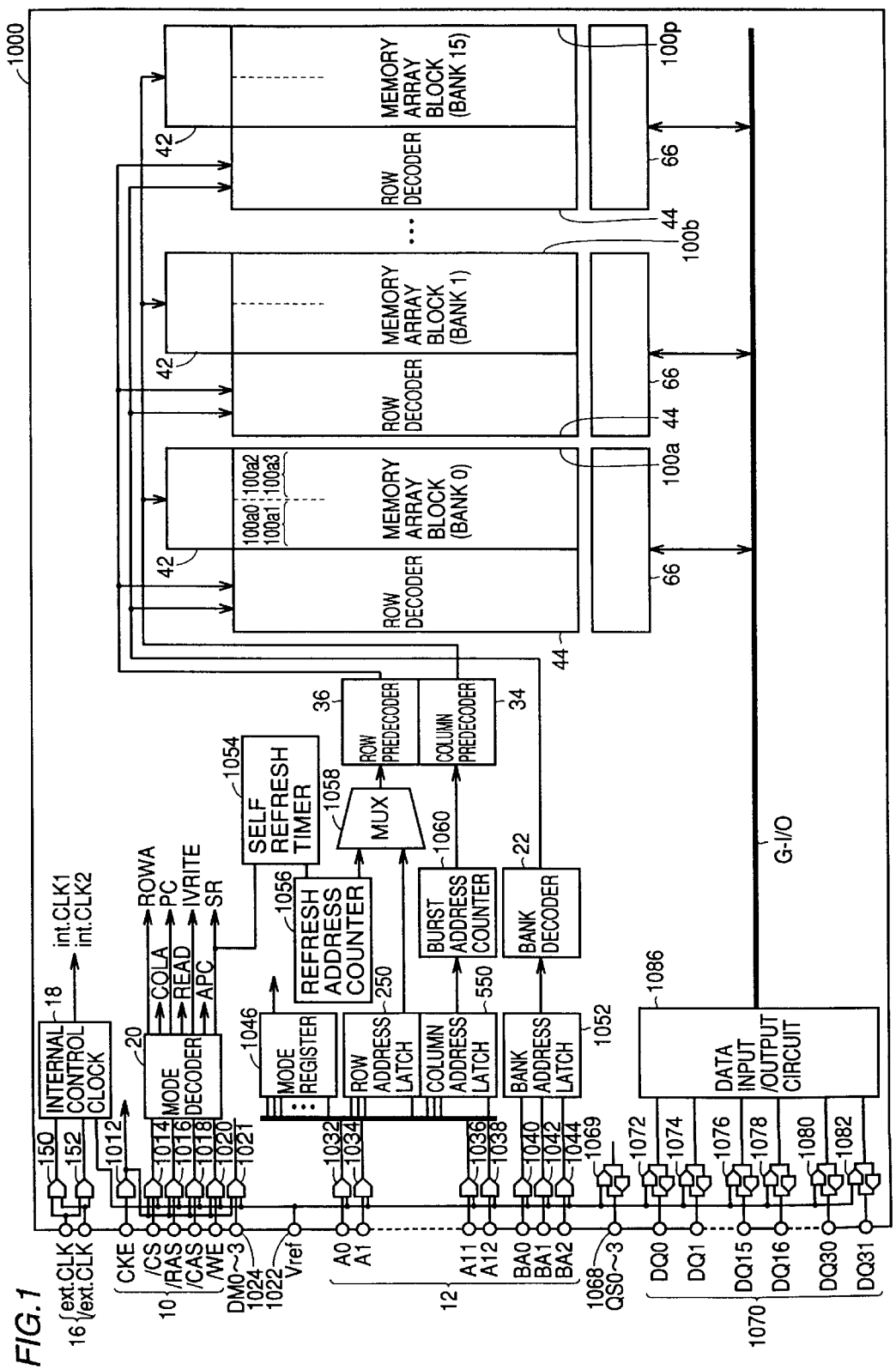
FIG. 1 is a schematic block diagram showing the concept of a structure of a synchronous semiconductor memory device 1000 according to a first embodiment of the present invention.

FIG. 1 is a schematic block diagram showing the concept of the structure of a synchronous semiconductor memory device 1000 according to a first embodiment of the present invention.

SDRAM 1000 includes an external clock signal input terminal 16 receiving externally applied complementary clock signals ext.CLK and ext./CLK, clock input buffers 150 and 152 for buffering the clock signal applied to external clock terminal 16, an internal control clock signal generation circuit 18 receiving the outputs of clock buffers 150 and 152 to generate a first internal clock signal int.CLK1 and a second internal clock signal int.CLK2, and a mode decoder 20 receiving via input buffers 1012–1020 operating according to second internal clock signal int.CLK2 an external control signal applied via external control signal input terminal 10.

Second internal clock signal int.CLK2 is a signal having a frequency identical to that of external clock signal ext.CLK. First internal clock signal int.CLK1 is a signal having a frequency two times that of external clock signal ext.CLK.

A signal CKE, a chip select signal /CS, a row address strobe signal /RAS, a column address strobe signal /CAS, a write control signal /WE, and data mask signals DM0–DM3 are applied to external control signal input terminal 10.

Signal CKE serves to designate that input of a control signal to a chip is possible. Unless this signal is activated, control signal input is not permitted so that the chip cannot operate.

Signal /CS serves to identify whether a command signal is input or not. When this signal is at a state of activation (L level), identification of the command is carried out according to the combination of the levels of other control signals at the rising edge of the clock signal.

Signal /RAS serves to designate the operation of row related circuitry. Signal /CAS serves to designate activation of the operation of column related circuitry. Signal /WE serves to identify a write or read operation.

Signals DM0–DM3 designate the mask operation of data input/output with respect to data input/output terminals DQ0–DQ7, DQ8–DQ 15, DQ16–DQ23 and DQ24–DQ31, respectively.

Mode decoder 20 outputs an internal control signal to control the operation of the internal circuit of SDRAM 1000 according to these external control signals. Mode decoder 20 outputs, for example, signals ROWA, COLA, ACD, PC, READ, WRITE, APC and SR as internal control signals.

Signal ROWA indicates that row related access is to be carried out. Signal COLA indicates that column related access is to be carried out. Signal ACT designates activation of a word line.

Signal PC designates a precharge operation to specify the end of a row related circuit operation. Signal READ designates a readout operation with respect to row related circuitry. Signal WRITE designates a write operation with respect to column related circuitry.

Signal APC designates an automatic precharge operation. When this automatic precharge operation is specified, a precharge operation is automatically initiated upon the end of a burst cycle. Signal SR designates a self refresh operation. When a self refresh operation is initiated, a self refresh timer operates. At an elapse of a predetermined time, a word line is activated to initiate a refresh operation.

SDRAM 1000 further includes a self refresh timer 1054 initiating its operation upon designation of a self refresh mode by signal SR to activate a word line, i.e., designate initiation of a refresh operation, at an elapse of a predetermined time, and a refresh address counter 1056 to generate an address to carry out a refresh operation according to designation from self refresh timer 1054.

SDRAM 1000 further includes a reference potential input terminal 1022 receiving a signal VREF which becomes the reference of determining an H level or an L level of an input signal, a mode register 1046 maintaining information of a predetermined operation mode such as the data of a burst length, and information associated with whether a single data rate operation or a double data rate operation is specified according to the combination of the address signal applied via address signal input terminal 12 and the above-described external control signals, a row address latch 250 receiving an address signal via address signal input buffers 1032–1038 operating according to second internal clock signal int.CLK2 to retain an input row address at the timing of the row address input, a column address latch 550 receiving address signals A0–A12 to retain a column address at the input timing thereof, a multiplexer 1058 receiving the outputs from refresh address counter 1056 and row address latch 250 to select and output the output from row address latch 250 in a normal operation and from refresh address counter 1056 in a self refresh operation, a row predecoder 36 receiving the output from multiplexer 1058 to predecode a row address, a burst address counter 1060 generating an internal column address according to the burst length data from mode register 1046 on the basis of the column address retained in column address latch 550, a column predecoder 34 receiving the output of burst address counter 1060 to predecode a corresponding column address, a bank address latch 1052 receiving via input buffers 1040–1044 operating according to internal clock signal int.CLK2 bank addresses BA0–BA2 applied through address input terminal 12 to retain a specified bank address value, and a bank decoder 22 receiving an output of bank address latch 1052 to decode the bank address.

The address signal applied to address signal input terminal 12 is used to write data into mode register 1046 according to a combination of several bits of the address signal in writing operation mode information to mode register 1046. For example, the value of burst length BL, CAS latency CL and the like are specified by the combination of a predetermined number of bits of the address signal.

Bank address signals BA0–BA2 designate an access bank in respective cases of row related access and column related access. More specifically, in the row related and column related access operations, bank address signals BLA0–BLA2 applied to address signal input terminal 12 are input to bank address latch 1052 and decoded by bank decoder 22 to be transmitted to each memory array block (bank).

SDRAM 1000 further includes memory array blocks 100a–100p operating as banks 0–16, respectively, which is the unit that can carry out a read/write operation independently, a row decoder 44 for selecting a row (word line) in a corresponding bank according to the outputs from bank decoder 22 and row predecoder 36, a column decoder 42 for selecting a column (bit line pair) in a corresponding bank according to an output from column predecoder 34, an I/O port 66 applying data read out from a selected memory cell of a selected bank to global I/O bus G-I/O in a readout operation and applying write data transmitted through bus G-I/O to a corresponding bank, a data input/output circuit 1086 retaining and applying to bus G-I/O externally applied write data in a write operation, and retaining read out data transmitted through bus G-I/O in a readout operation, and bidirectional input/output buffers 1072–1082 to transfer input/output data DQ0–DQ31 between data input/output circuit 1086 and data input/output terminal 1070.

Bidirectional input/output buffers 1072–1082 operate in synchronization with first internal clock signal int.CLK1 in a double data rate SDRAM (referred to as DDR-SDRAM hereinafter) operation mode and in synchronization with second internal clock signal int.CLK2 in a single data rate SDRAM (referred to as SDR-SDRAM hereinafter) operation mode according to the operation mode data retained in mode register 1046.

Signals QS0–QS3 input/output with respect to an input/output terminal 1068 via a bidirectional input/output buffer 1069 indicate the data input/output timing for data input/output terminals DQ0–DQ7, DQ8–DQ15, DQ16–DQ23, and DQ24–DQ31, respectively.

In a SDR-SDRAM operation mode, signals QS0–QS3 are generically referred to as signal QS. In a DDR-SDRAM operation mode, signals QS0–QS3 are generically referred to as signal DQ.

As mentioned above, SDRAM 1000 can operate switching between a SDR–SDRAM operation mode and a DDR-SDRAM operation mode. The operation as a DDR-SDRAM will be mainly described in the following.

Figure 2:
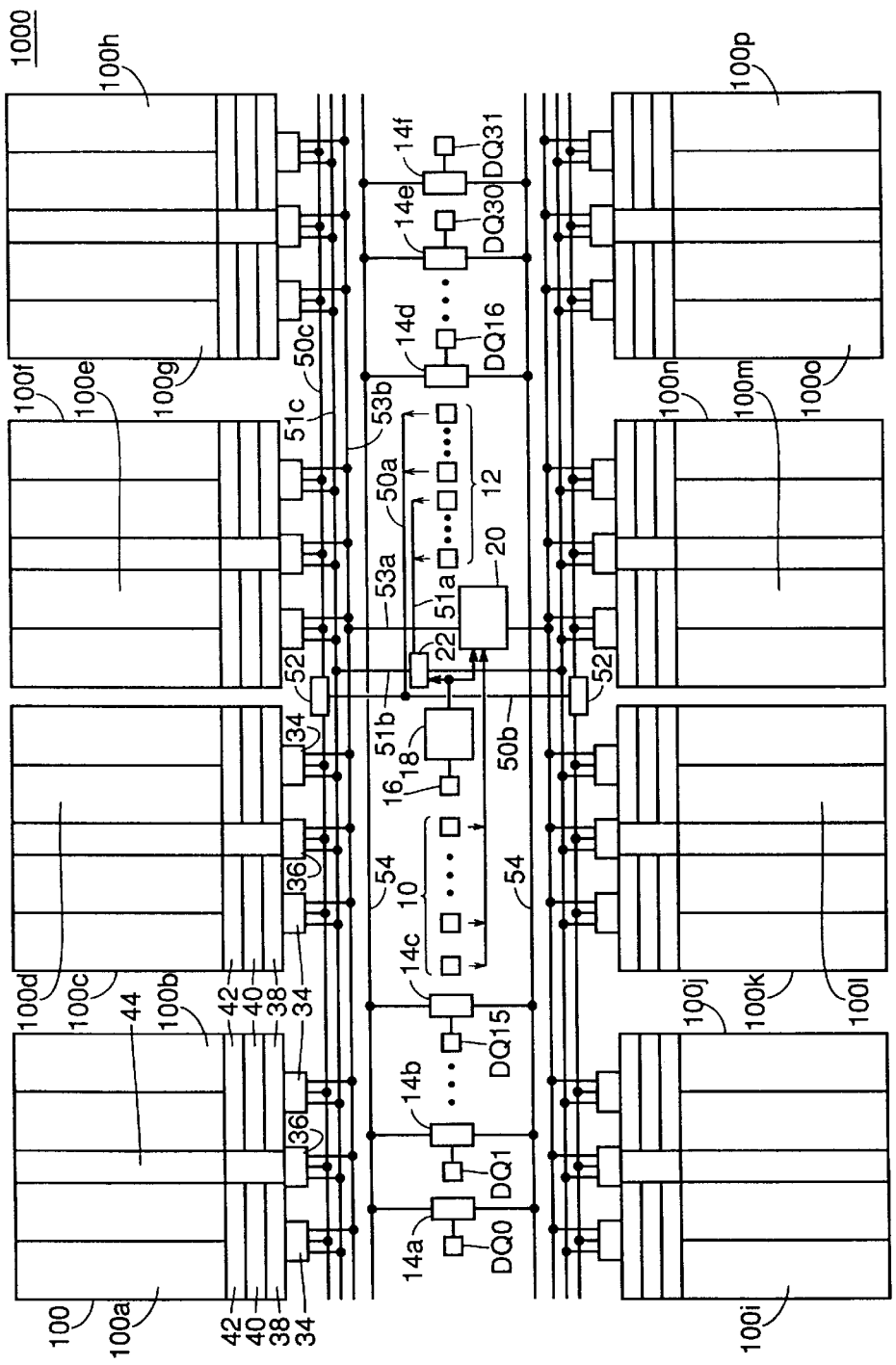
FIG. 2 is a block diagram for describing the structure of synchronous semiconductor memory device 1000 more specifically.

FIG. 2 is a schematic block diagram to described more specifically the structure of synchronous semiconductor memory device 1000 of the first embodiment.

Referring to FIG. 2, synchronous semiconductor memory device 1000 includes a mode decoder 20 receiving external control signals /RAS, /CAS, /W, /CS and the like applied via external control signal input terminal group 10 to decode the received signal to generate an internal control signal, command data buses 53a and 53b for transmitting the internal control signal output from mode decoder 20, and a memory cell array 100 in which memory cells are arranged in a matrix.

Memory cell array 100 is divided into a total of 16 memory cell blocks 100a–100p as shown in FIG. 2. When synchronous semiconductor memory device 100 has a storage capacity of 1G, for example, each memory cell block has a capacity of 64 Mbits. Each block has a structure that can operate independently as a bank.

Synchronous semiconductor memory device 1000 further includes an internal control clock generation circuit 1008 receiving complementary external clock signals ext.CLK and ext./CLK applied to clock signal input terminals 16a and 16b, respectively (clock signal input terminals are generically indicated by reference number 16 in the drawing) to initiate a synchronizing operation under control of mode decoder 20 to output internal clock signals int.CLK1 and int.CLK2.

External address signals A0–Ai (i: natural number) applied to address signal input terminal group 12 are input into synchronous semiconductor memory device 1000 in synchronization with second internal clock signal int.CLK2 under control of mode decoder 20.

Data of a predetermined number of bits out of external control signals A0–Ai are applied to bank decoder 22 via address bus 51a. Decoded bank addresses B0–B7 are transmitted from bank decoder 22 to each bank via address buses 51b and 51c.

Other external address signals applied to address signal input terminal group 12 are transmitted to address driver 52 via address buses 50a and 50b. An address signal is also transmitted from address driver 52 to each bank (memory cell block) via address bus 50.

Synchronous semiconductor memory device 1000 further includes a row predecoder 36 provided corresponding to each pair of memory cell blocks to latch and predecode the row address transmitted through address bus 50c under control of mode decoder 20, a row decoder 44 for selecting a corresponding row (word line) of a memory cell block selected by the output from row predecoder 36, a column predecoder 34 provided for each memory cell block to latch and predecoder the column address transmitted through address bus 50c under control of mode decoder 20, a column predecoder line 40 transmitting the output from predecoder 34, and a column decoder 42 selecting a corresponding column (bit line pair) of a memory cell block selected by the output from column predecoder 40.

Synchronous semiconductor memory device 1000 further includes data input/output terminals DQ0–DQ15 and DQ16–DQ31 and input/output buffer circuits 14a–14f provided corresponding to data input/output terminals DQ0–DQ31, respectively, allocated in a region along the direction of the longer side at the center of the chip, and outside the region where external control signal input terminal group 10 and address signal input terminal group 12 are provided, a data bus 54 for transmitting data between an input/output buffer and a corresponding memory cell block, and a read/write amplifier 38 provided corresponding to each of memory cell blocks 100a–100p to transfer data between data bus 54 and a selected memory cell column.

Although not shown in FIG. 2, input/output buffer circuits 14a–14f input/output data with respect to memory cell 100 via a data input/output circuit 1086 having a structure similar to that of FIG. 1.

The input operation of signals /CS, /RAS, /CAS and /W is carried out in synchronization with internal clock signal int.CLK2.

The input operation of an address signal to address signal input terminal group 12 is carried out in synchronization with second internal clock signal int.CLK2.

The data input/output via data input/output terminals DQ0–DQ31 is carried out in synchronization with first internal clock signal int.CLK1 or second internal clock signal int.CLK1 according to whether the mode is a SDR-SDRAM operation mode or a DDR-SDRAM operation mode. Also, there are cases where data input is carried out in synchronization with an externally applied signal DQS according to the operation mode.

[Distributed arrangement of redundant column]

Figure 3:
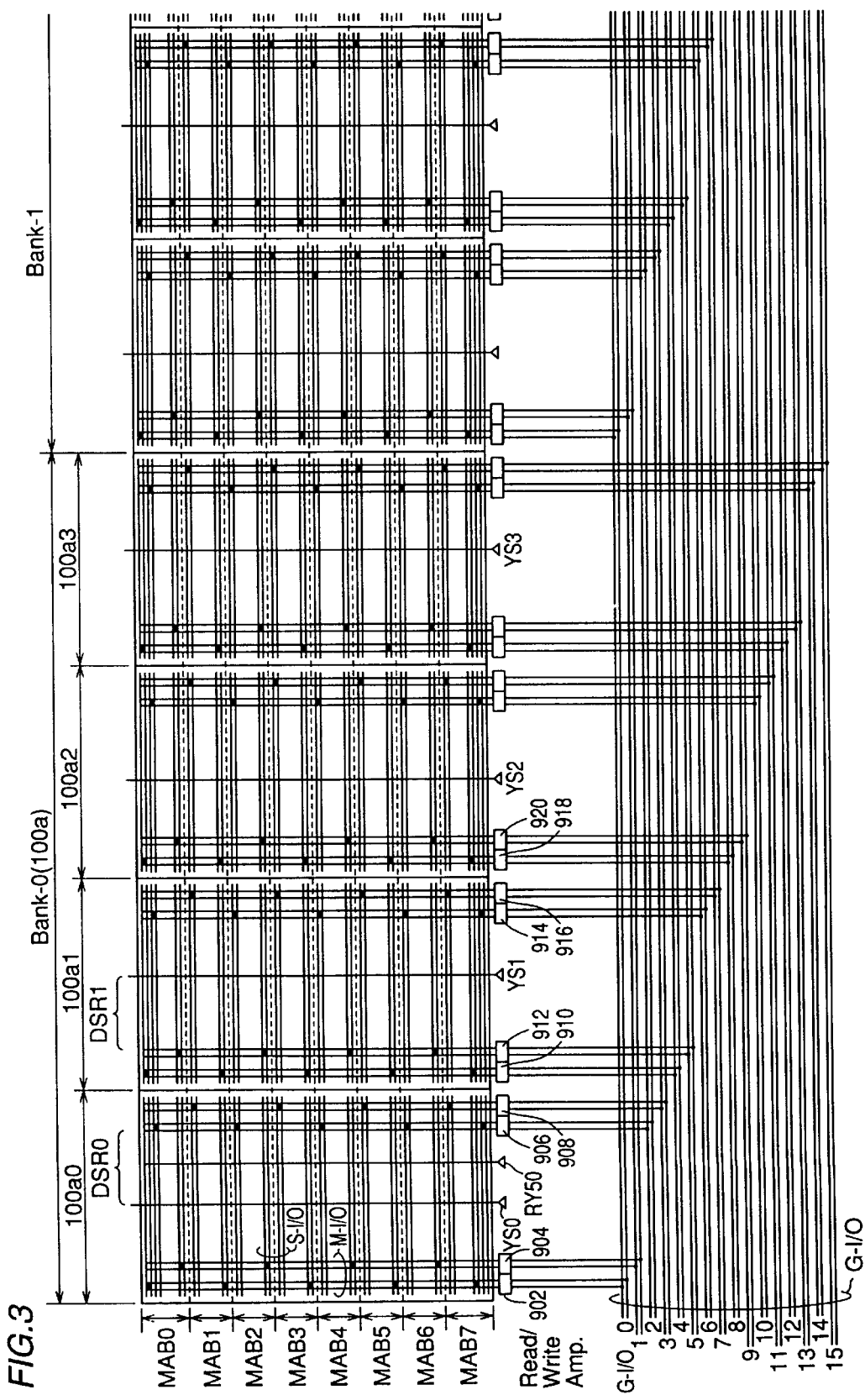
FIG. 3 is a block diagram showing an example of an arrangement of a sub I/O pair S-I/O and a main I/O line pair M-I/O.

FIG. 3 is a block diagram showing an example of the arrangement of sub I/O line pairs S-I/O and main I/O line pairs M-I/O through which the data read out from a memory array bank of FIG. 2 is transmitted to global I/O data bus G-I/O.

Referring to FIG. 3, bank 0 (corresponding to memory cell array block 100a of FIG. 2) is divided into four regions 100a0–100a3.

Regions 100a0 and 100a1 which are two of the divided regions adjacent to each other form the regions corresponding to an even numbered address.

Regions 100a2 and 100a3 form the regions corresponding to an odd numbered address.

Bank 0 (Bank-0) corresponds to one (a region of 64 Mbit) of the 16 banks dividing memory cell array 100 of FIG. 2. In SDRAM 1000 of FIG. 2, 16 data must be output from bank 0 due to the structure where 32 data are output at one time. More specifically, according to the structure of FIG. 2, one of banks 100*a*, 100*b*, 100*c*, 100*d*, 100*i*, 100*j*, 100*k* and 100*l* belonging to the left-half side of the structure is rendered active so that data is output from corresponding data input output terminals DQ0–DQ15 in a readout operation. One of banks 100*e*, 100*f*, 100*g*, 100*i*, 100*m*, 100*n*, 100*o* and 100*p* belonging to the right-half side of the structure in FIG. 2 is rendered active, whereby data is output from corresponding data input/output terminals DQ16–DQ31.

Therefore, 8 data must be output from respective regions in one bank corresponding to an even numbered address and an odd numbered address. As shown in FIG. 3, each of regions 100*a*0–100*a*3 is divided into 8 memory cell array mats MAB0–MAB7 along the column direction. A sense amplifier band (not shown) is present corresponding to each region of each memory cell array mat to amplify data from a selected memory cell.

The structure of region 100*a*0 will be described representative of the regions.

A sub I/O line pair S-I/O extends in the word line direction (the direction along G-I/O in the drawing) for each mat. By the connection with the sense amplifier of a corresponding memory cell column in response to activation of a column select line YS selected according to an external address signal, the readout data amplified by the amplifier is transmitted to sub I/O line pair S-I/O. This sub I/O line pair S-I/O has a complementary structure in which one data is transmitted through two lines.

A main I/O line pair M-I/O extends in the vertical direction with respect to each memory cell array mat (direction vertical to G-I/O, the column direction of the memory cell array). The data transmitted by a sub I/O line pair is amplified by a subamplifier located at the crossing between sub I/O line pair S-I/O and main I/O line pair M-I/O to be transmitted to a corresponding main I/O line pair M-I/O. The readout data transmitted through main I/O line pair M-I/O is amplified by read/write amplifiers 902, 904, 906 and 908 to be transmitted to a corresponding global I/O bus G-I/O.

The main I/O line pair has a complementary structure in which one data is transmitted through two lines.

In FIG. 3, the region represented by a rectangle at the crossing of a sub I/O line pair and a main I/O line pair indicates the position of a transfer gate and a subamplifier that connects a sub I/O line pair S-I/IO and a main I/O line pair M-I/O.

In a write operation, external data is written into a selected memory cell via a path opposite to that described above.

When bank 0 is selected, 16 data must be output therefrom as mentioned above.

The number of memory cells selected by the activation of one column select line is 4, as will be described afterwards. Therefore, two column select lines YS (called column select line YS in generically referring to a column select line) in each of the even numbered address region and odd numbered address region.

In the structure of FIG. 3, column select line YS0 in region 100*a*0, column select line YS1 in region 100*a*1, column select line YS2 in region 100*a*2, and column select line YS3 in region 100*a*3 are respectively activated to read out 16 data.

When there is a defect in the memory cell column selected by column select line YS0 in region 100*a*0, replacement with a memory cell column in redundant memory cell column region DSR0 provided corresponding to region 100*a*0 is effected. Therefore, when column select line YS0 is selected according to an external address signal, a column select line RYS0 in redundant column region DSR0 will be selected instead.

In order to transmit 16 data to corresponding global I/O buses G-I/O in bank 0 (Bank-0), column select line YS in all of regions 100*a*0–100*a*3 must be rendered active.

When regular column select line YS0 is to be replaced with redundant column select line RYS0 and regular column select line YS0 that is the subject of replacement is accessed, activation of column select line YS0 must be canceled and redundant column select line RYS0 rendered active in the range of region 100*a*0 to which column select line YS0 belongs. This means that the area that can be repaired by redundant column region DSR0 is limited to region 100*a*0.

By the replacement of column select line YS0 with redundant column select line RYS0, determination is made whether repairment by such a redundant column is to be carried out or not after an external address signal is applied, and then data is read out from bank 0 (Bank-0) to obtain all the 16 data. Therefore, the access will be delayed.

Figure 4:
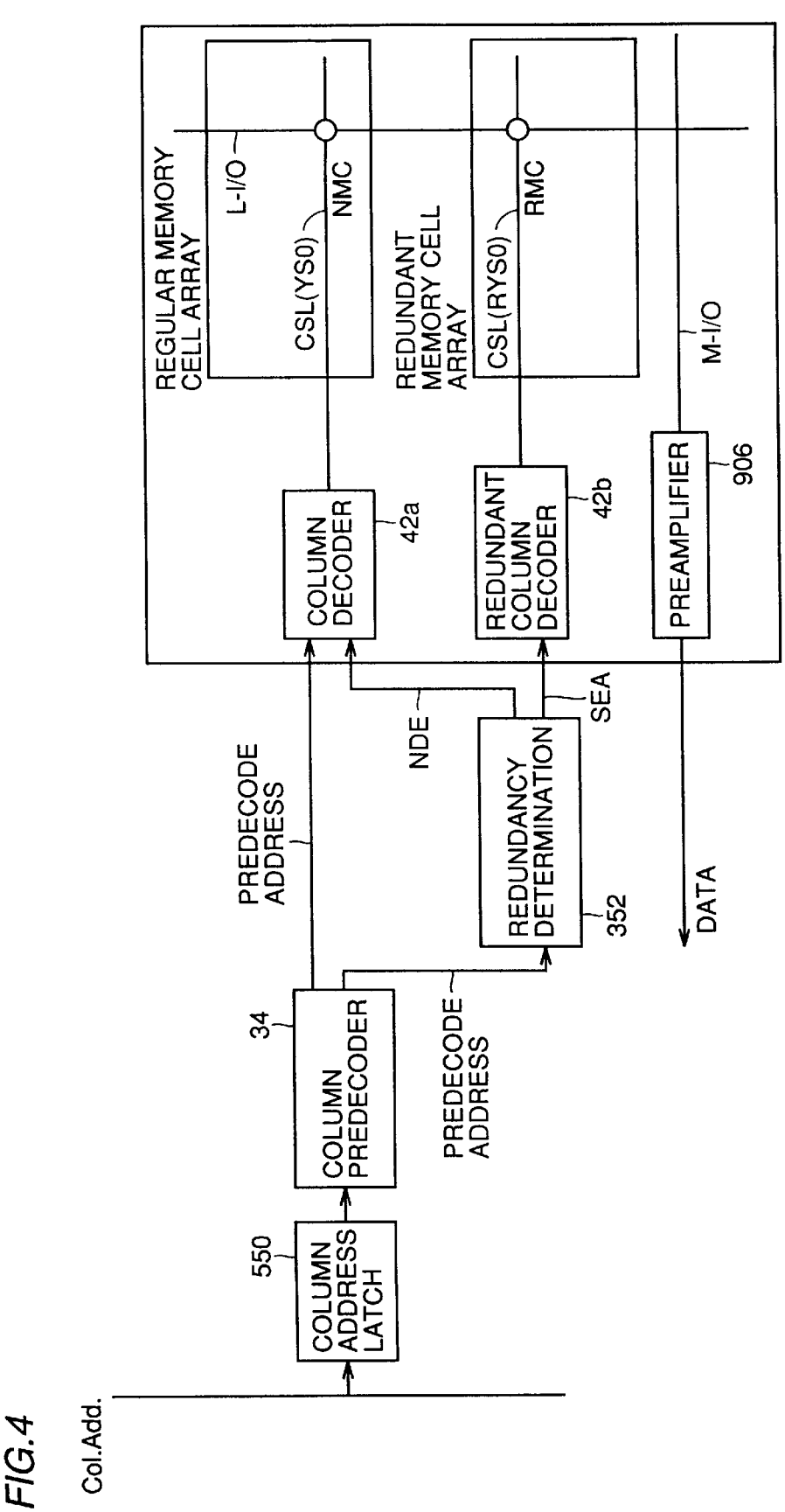
FIG. 4 is a block diagram showing a structure of a column select circuit when a redundant column is arranged in a distributed manner.

FIG. 4 is a schematic block diagram showing a structure of a column select circuit corresponding to the case where a redundant column is arranged in a distributed manner.

A column address signal Col.Add. transmitted via an address bus is input to be retained at column address latch 550. Then, the address signal predecoded by column predecoder 34 is applied to column decoder 42*a* corresponding to the regular memory cell array and to a redundancy determination circuit 352.

In redundancy determination circuit 352, the address of the memory cell column including the defective bit residing in the regular memory cell array that is to be replaced with a redundant column is preprogrammed by a fuse element.

When determination is made that column address signal Col.Add. matches the address of the defective memory cell column, redundancy determination circuit 352 activates a regular inactivation signal NDE applied to column decoder 42*a* and also activates a redundant column activation signal SEA with respect to redundant column decoder 42*b*. In response, the operation of column decoder 42*a* is ceased. Column select signal line RYS0 corresponding to redundant column decoder 42*b* is rendered active. Memory cell RMC in the redundant memory cell array is selected instead of memory cell NMC of the regular memory cell, whereby the readout data is transmitted to an output buffer (not shown) via local (sub) I/O line pair L-I/O, main I/O line pair M-I/O, and global I/O line pair G-I/O.

When redundancy determination circuit 352 determines that column address signal Col.Add. does not match the column address of the defective memory cell, the data read out from regular memory cell NMC corresponding to activated column select line YS0 selected by column decoder 42*a* is transmitted to an output buffer (not shown) via local I/O line pair L-I/O, main I/O line pair M-I/O, and global I/O line pair G-I/O.

Since local I/O line pair L-I/O, main I/O line pair M-I/O, and the preamplifier unit are common to the regular memory cell array and the redundant memory cell array in the above structure, only one common control signal for preamplifier 906 is required. However, the two signals of NDE and SEA are required to indicate the determination result of activating either the regular memory cell array side or the redundant memory cell array side for the column select line. In other words, an operation margin is required for the activation operation of the column select line until the states of signals NDE and SEA are ascertained.

Figure 5:
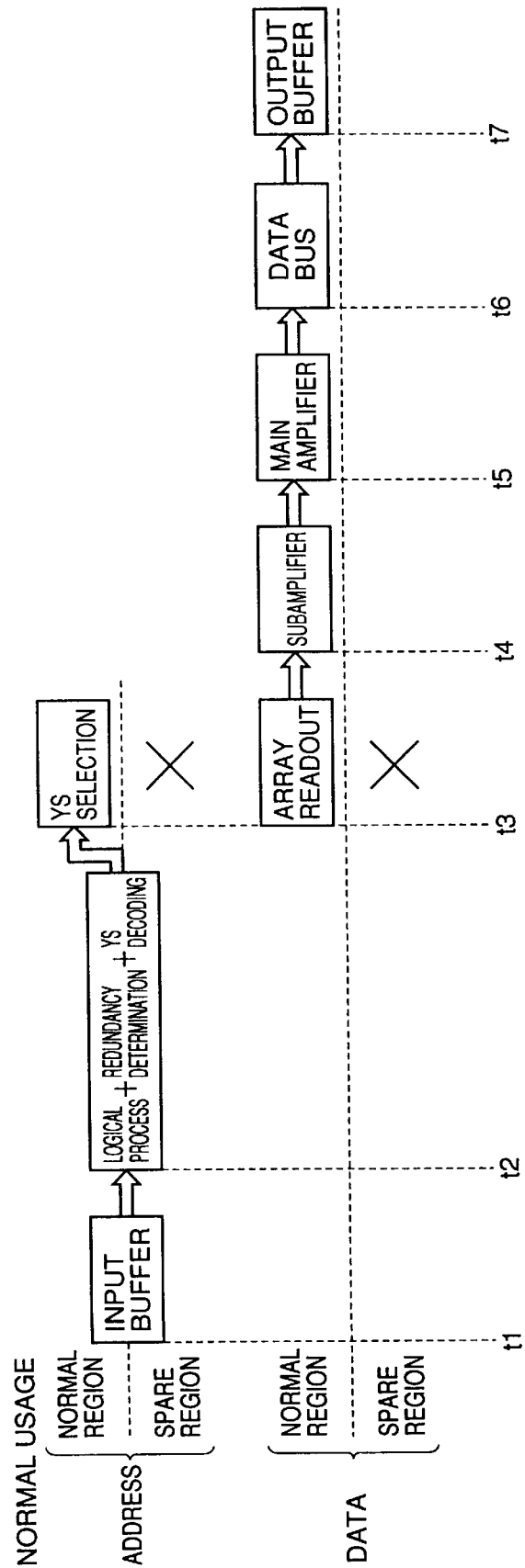
FIG. 5 is a diagram for describing the process flow from input of a column address signal up to output of data in a readout operation when a regular memory cell column is selected.
Figure 6:
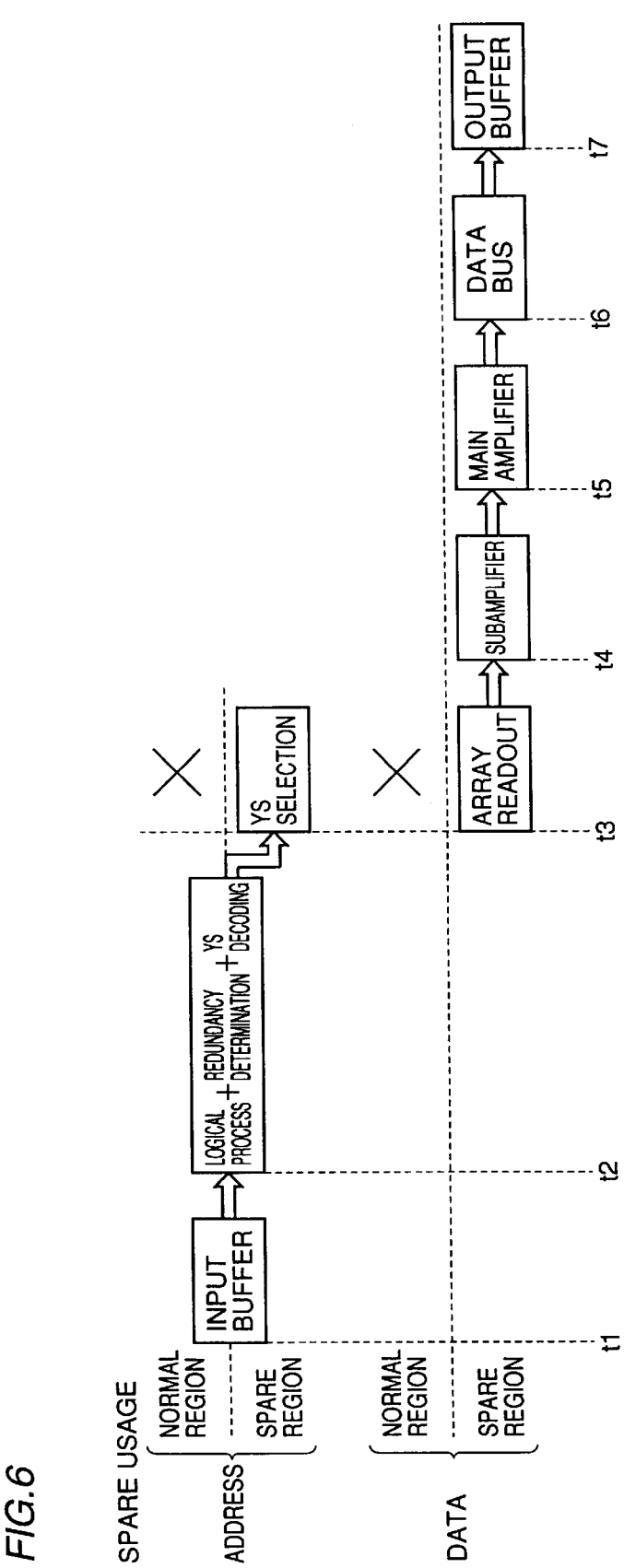
FIG. 6 is a diagram for describing the process flow from input of a column address signal up to output of data in a readout operation when a redundant column is selected.

FIGS. 5 and 6 are diagrams to describe the process flow from the input of a column address signal up to data output in such a readout operation, the former corresponding to the selection of a regular memory cell column and the latter corresponding to the selection of a redundant column.

Referring to FIGS. 5 and 6, an external column address signal is applied to the address signal input buffer at time t1.

At time t2, the logic process with respect to generation of an internal address for indicating whether data is to be read out from an even numbered address region or an odd numbered address region according to the applied column address signal is initiated. Following the determination of whether replacement with a redundant column is to be carried out or not according to an internal address, the decoding process of a column select line associated with which of the column select lines is to be rendered active is carried out.

Following the above-described process, a corresponding column select line YS is selected at time t3. A column select line YS for a regular memory cell column (normal region) is selected in FIG. 5 whereas a column select line in a redundant region (spare region) is selected in FIG. 6.

In response, data read out is initiated from the selected memory cell column via sub I/O line pair S-I/O at time t3.

At time t4, the data amplify operation is initiated at the subamplifier corresponding to the selected memory cell column in the normal region in FIG. 5 and the spare region in FIG. 6. The data transmitted by sub I/O line pair S-I/O is output to main I/O line pair M-I/O.

At time t5, the readout data transmitted by main I/O line pair M-I/O is amplified by the read/write amplifier (main amplifier).

At time t6, the data amplified by the main amplifier is output to a corresponding global I/O bus G-I/O.

At time t7, the readout data transmitted by global I/O bus G-I/O is output from the output buffer to a data input/output terminal.

According to the structure of sub-I/O line pair S-I/O and main I/O line pair M-I/O in FIG. 3, the corresponding column select line YS is selected only after all the column select lines in each of regions 100a–100a3 corresponding to an externally applied column address are rendered active, i.e., at the completion of the logic process, redundancy determination, and YS decoding process at time t2. Data output to sub I/O line pair S-I/O is initiated only from time t3.

This means that the YS decoding process and the activation operation of column select line YS can be initiated only at the elapse of the processing time of carrying out redundancy determination regardless of whether replacement with a redundant memory cell column is carried out or not.

[Centralized arrangement of redundant memory cell column]

Figure 7:
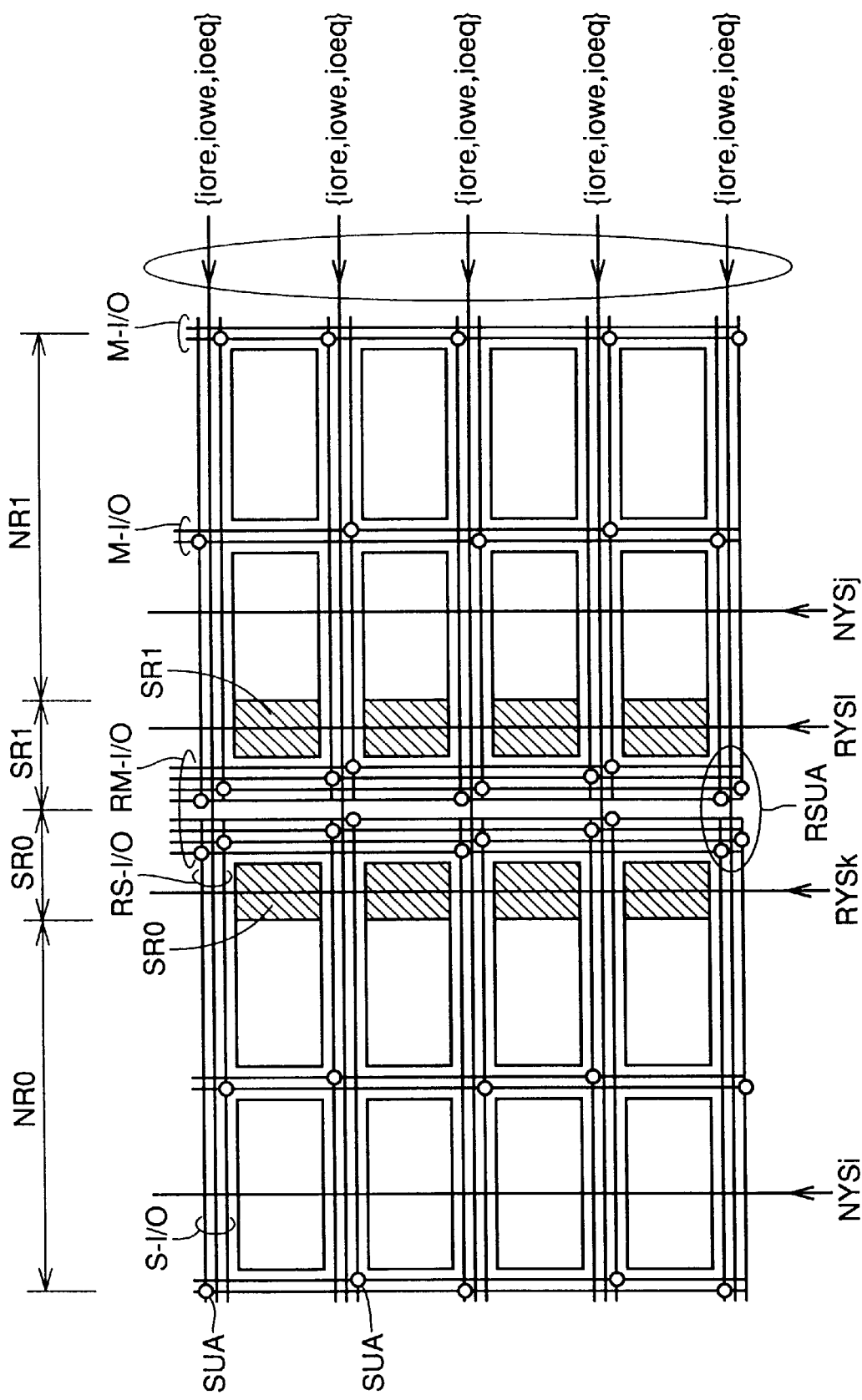
FIG. 7 is a schematic block diagram showing an arrangement of an I/O line pair and a redundant memory cell column in a bank in a SDRAM 1000.

FIG. 7 is a schematic block diagram showing the arrangement of sub I/O line pairs S-I/O, main I/O line pairs M-I/O, and redundant memory cell columns in SDRAM 1000 of the first embodiment.

The structure of FIG. 7 differs from that of FIG. 3 as set forth in the following.

In each of regions 100a0–100a3 of bank 0 (Bank0), sub I/O line pair S-I/O running in the word line direction (row direction) is divided into a sub I/O line pair S-I/O corresponding to a regular memory cell column region, and sub I/O line pair RS-I/O corresponding to a redundant memory cell column region.

Also, a main I/O line pair RM-I/O dedicated to a redundant memory cell column region is provided at the boundary region between regions 100a0 and 100a1.

Furthermore, signals iore, iowe, ioeq for designating the activation of subamplifier SUA, the transfer gate and the equalize circuit provided at the connection between sub I/O line pair S-I/O and main I/O line M-I/O in the regular memory cell array region are transmitted by the same signal line of signals iore, iowe, ioeq designating the activation of subamplifier RSUA, the transfer gate, and the equalize circuit located at the crossing between sub I/O line pair RS-I/O and main I/O line pair RM-I/O in the redundant memory cell column region.

Signal iore indicates activation of a subamplifier in a readout operation. Signal iowe indicates activation of a subamplifier in a write operation. Signal ioeq indicates activation of an equalize circuit.

Figure 8:
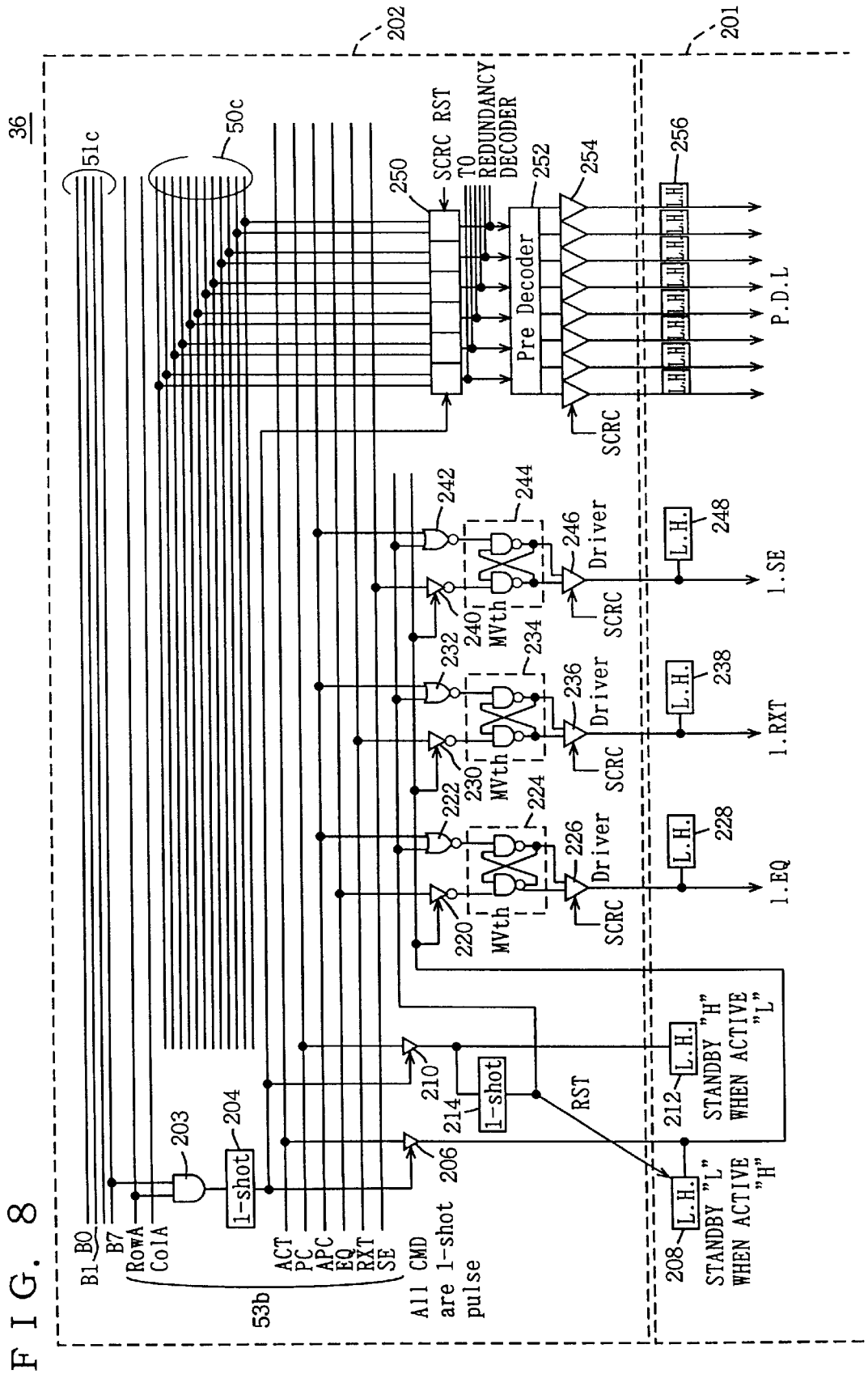
FIG. 8 is a schematic block diagram of a structure of a row predecoder 36.

FIG. 8 is a schematic block diagram for describing a structure of row predecoder 36 in the structure of FIG. 2.

Column address bus 53b transmits a signal RowA indicating activation of a row related circuit operation, a column ColA indicating activation of a column related circuit operation, a signal ACT indicating activation of the operation of internal circuitry, a signal PC designating bank reset (precharge), a signal APC designating precharge of all banks, a signal EQ designating cancel of equalization of bit lines and disconnecting an unused bit line from a sense amplifier, a signal RXT designating activation of a word line, a signal SE designating activation of a sense amplifier, and the like.

Bank address bus 51c transmits bank address signals B0–B7 decoded by bank decoder 22. Address bus 50c transmits an address bus from address driver 52.

When bit data B7, for example, out of the bank address signal is rendered active and signal RowA is rendered active, a signal of an active state is output from an AND circuit 203. In response, an active one shot pulse is output from a one shot pulse generation circuit 204.

In response, a driver circuit 206 is rendered active. Signal ACT is input and the level thereof is retained by a level retain circuit 208.

Similarly, in response to a signal from one shot pulse generation circuit 204, a driver circuit 210 is rendered active. The level of signal PC is retained by level retain circuit 212. In response to the output from driver circuit 210, one shot pulse generation circuit 214 outputs a reset signal to level retain circuit 208. Inverter 220 responds to the output signal from level retain circuit 208 to be rendered active to receive and output signal EQ. NOR circuit 222 receives signal APC and the signal from one shot pulse generation circuit 214 to output the NOR operation result. A flip-flop circuit 224 is set and reset according to the outputs from inverters 220 and NOR circuit 222, respectively. Driver circuit 226 that is rendered active according to a hierarchical power source control signal SCRC that will be described afterwards receives the output of flip-flop circuit 224. This output is provided from driver circuit 226 to be retained by level retain circuit 228. The output of level retain circuit 228 is applied to a corresponding memory cell block as a signal 1.EQ.

Similarly, flip-flop circuit 234 is rendered active according to the signal from level retain circuit 208. Flip-clop circuit 234 is set by the output of inverter 230 that receives signal RXT transmitted by a command data bus 53b as an input, and reset by the output of NOR circuit 232 receiving signal APC transmitted through one shot pulse generation circuit 214 and command data bus 53b. Driver circuit 236 receives the output of flip-flop circuit 234, and is rendered active by hierarchical power source control signal SCRC. The level of the output of driver circuit 236 is retained by level retain circuit 238. The output of level retain circuit 238 is provided to a corresponding memory cell block as a signal 1.RXT.

Flip-flop circuit 244 receives signal SE transmitted via command data bus 53b. Flip-flop circuit 244 is set by an output of inverter 240 that is rendered active according to the output level of level retain circuit 208, and is reset according to an output of NOR circuit 242 that receives the output signal of one shot pulse generation circuit 214 and signal APC transmitted via command data bus 53b.

Driver circuit 246 receives the output of flip-flop circuit 244 and is rendered active by hierarchical power source control signal SCRC. The level of the output of driver circuit 246 is retained by level retain circuit 244. The output of level retain circuit 244 is provided to a corresponding memory cell block as a signal 1.SE.

Latch circuit 250 is reset according to activation of hierarchical power source control signal SCRC, and is rendered active according to activation of one shot pulse generation circuit 204 to retain the address signal transmitted through address data bus 50c. The output from latch circuit 250 is applied to a redundant address decoder (not shown) and also to predecoder 252. The predecoded result is applied to driver circuit 254 that is rendered active according to hierarchical power source control signal SCRC.

The output from driver circuit 254 is retained by level retain circuit 256. The output of level retain circuit 256 is provided to a corresponding row predecoder line.

In the structure of row predecoder 36 of FIG. 8, the region 201 including level retain circuits 208, 212, 228, 238 and 248 and level retain circuit 256, and the corresponding memory cell block corresponds to the region that is not controlled by hierarchical power source control signal SCRC. In this region, the elements always operate with power supply potential VCC and ground potential VSS as the power supply potentials in both an active state and in a standby state.

In contrast, the region 202 in row predecoder 36 is under control of hierarchical power source control signal SCRC. The elements in region 202 operate receiving power supply potential Vcc and ground potential Vss during the period where signal SCRC is active, and operates with a potential lower than power supply potential Vcc and a potential higher than ground potential Vss as respective power supply potentials during the inactive period (L level) of hierarchical power source control signal SCRC. Such a structure allows power consumption to be reduced.

Figure 9:
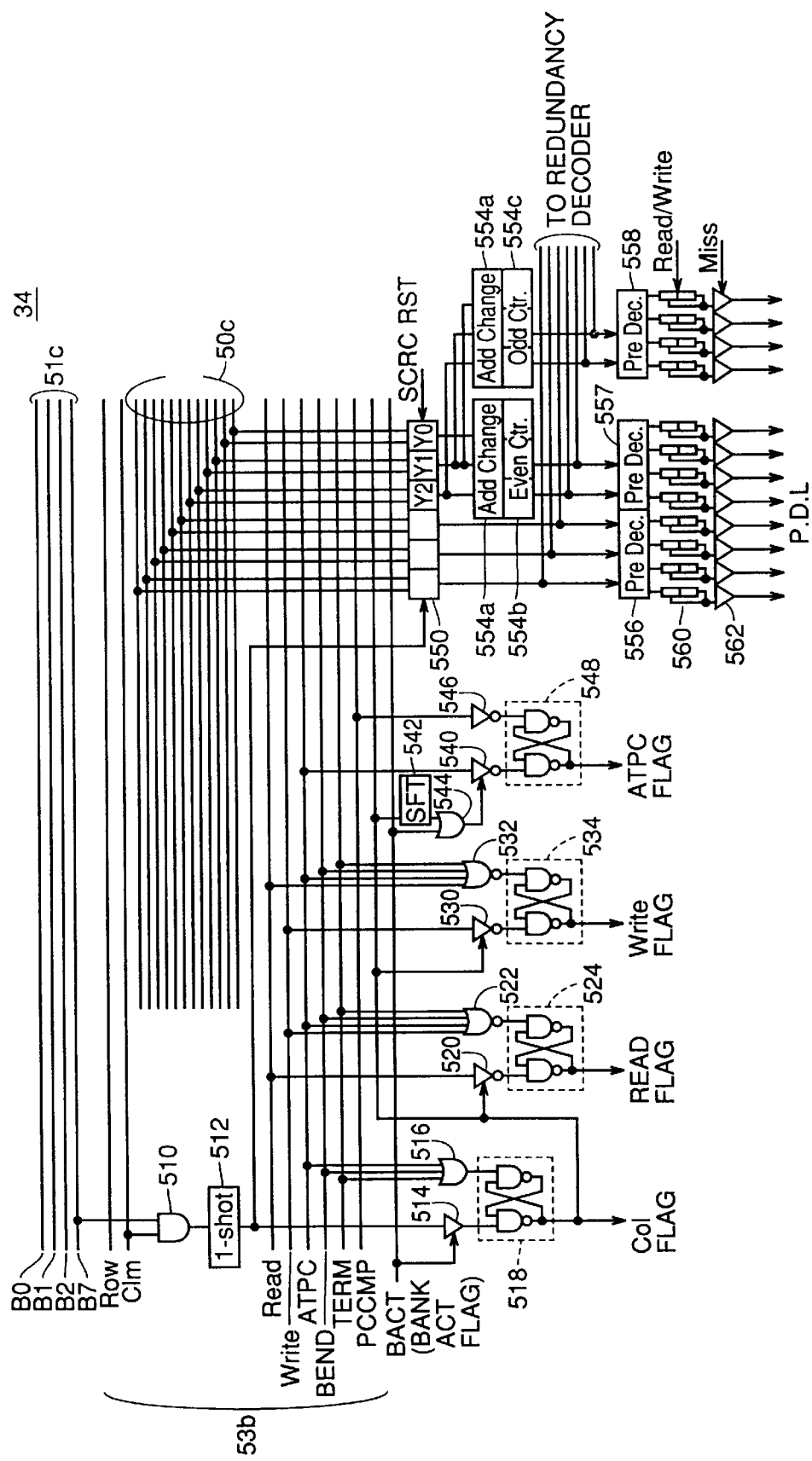
FIG. 9 is a schematic block diagram of a structure of a column predecoder 34.

FIG. 9 is a schematic block diagram showing a structure of column predecoder 34.

Referring to FIG. 9, control circuit 20 transmits through command data bus 53b a read related access identification signal READ to designate a read out operation, a write related access identification signal WRITE to designate a write operation, an automatic precharge identification signal ATPC to designate an automatic precharge operation, a burst end identification signal BEND to designate the end of a burst operation for each bank, a termination identification signal TERM to force the column select operation to end when another bank is selected during a column select operation, and a precharge operation identification signal PCCM to designate the end of a precharge operation.

Signal BACT is a flag signal retained in level retain circuit 208 in response to selection of a bank.

Column predecoder circuit 34 includes an AND circuit 510 receiving a signal ColA transmitted through command data bus 53b and a bank address signal B7, a one shot pulse generation circuit 512 generating a one shot pulse signal according to activation of the output of AND circuit 510, a driver circuit 514 rendered active according to activation of flag signal BACT to drive the output of one shot pulse generation circuit 512, an OR circuit 516 receiving signals ATPC, BEND, and TERM, and a flip-flop circuit 518 set by an output of drive circuit 514 and reset by an output of OR circuit 516 to output a column flag signal Col.FLAG indicating activation of a column related operation.

Column predecoder 34 further includes an inverter circuit 520 rendered active according to activation of column flag signal Col.FLAG to drive signal READ transmitted through command data bus 53b, an OR circuit 522 receiving signals WRITE, ATPC, BEND, and TERM, and a flip-flop circuit 524 set by an output of inverter circuit 520 and reset by an output of OR circuit 522 to output a read flag signal READ.FLAG indicating activation of a readout operation.

Column predecoder circuit 34 further includes an inverter circuit 530 rendered active according to activation of column flag signal Col.FLAG to drive a signal WRITE transmitted through command data bus 53b, an OR circuit 532 receiving signals READ, ATPC, BEND, and TERM, and a flip-flop circuit 524 set according to an output of inverter circuit 530 and reset according to an output of OR circuit 532 to output a write flag signal WRITE.FLAG indicating activation of a write operation.

Column predecoder circuit 34 further includes a shift circuit 542 receiving column flag signal Col.FLAG to delay the signal for a predetermined clock time, an OR circuit 540 receiving flag signal BACT and the output of shift circuit 542, an inverter circuit 544 rendered active according to activation of the output of OR circuit 540 to drive a signal ATPC transmitted through command data bus 53b, an inverter circuit 546 receiving a signal PCCMP transmitted through command data bus 53b, and a flip-flop circuit 548 reset according to an output of inverter circuit 544 and reset according to an output of inverter circuit 546 to output an automatic precharge flag signal ATPC.FLAG indicating activation of an automatic precharge operation.

Column predecoder circuit 34 further includes a latch circuit 550 rendered active according to an output signal of one shot pulse generation circuit 512 to input the column signal transmitted through address bus 50c. Latch circuit 550 is reset according to activation of signal SCRC.

Column predecoder circuit 34 further includes an even number bit adjust circuit 554b and an odd number bit adjust circuit 554c for adjusting the less significant bits of the address signal corresponding to an activated column select line (not shown) according to the less significant bits of the column address retained in latch circuit 550, a predecoder 556 predecoding the more significant bit data from latch circuit 550, a predecoder 557 predecoding the less significant bit data from even number bit adjust circuit 552, a predecoder 558 predecoding the less significant bit data from odd number bit adjust circuit 554, a shift circuit 560 rendered active by signal READ or WRITE to delay the predecoded signal from predecoders 556, 557 and 558 by a predetermined number of clocks (for example, 2 clocks), and a drive circuit 562 receiving the output from shift circuit 560 to drive the level of the column predecode line according to the output signal of shift circuit 560.

Drive circuit 562 may be rendered active according to a signal Miss indicating that the address from the redundancy decoder (not shown) does not correspond to the defective address.

Figure 10:
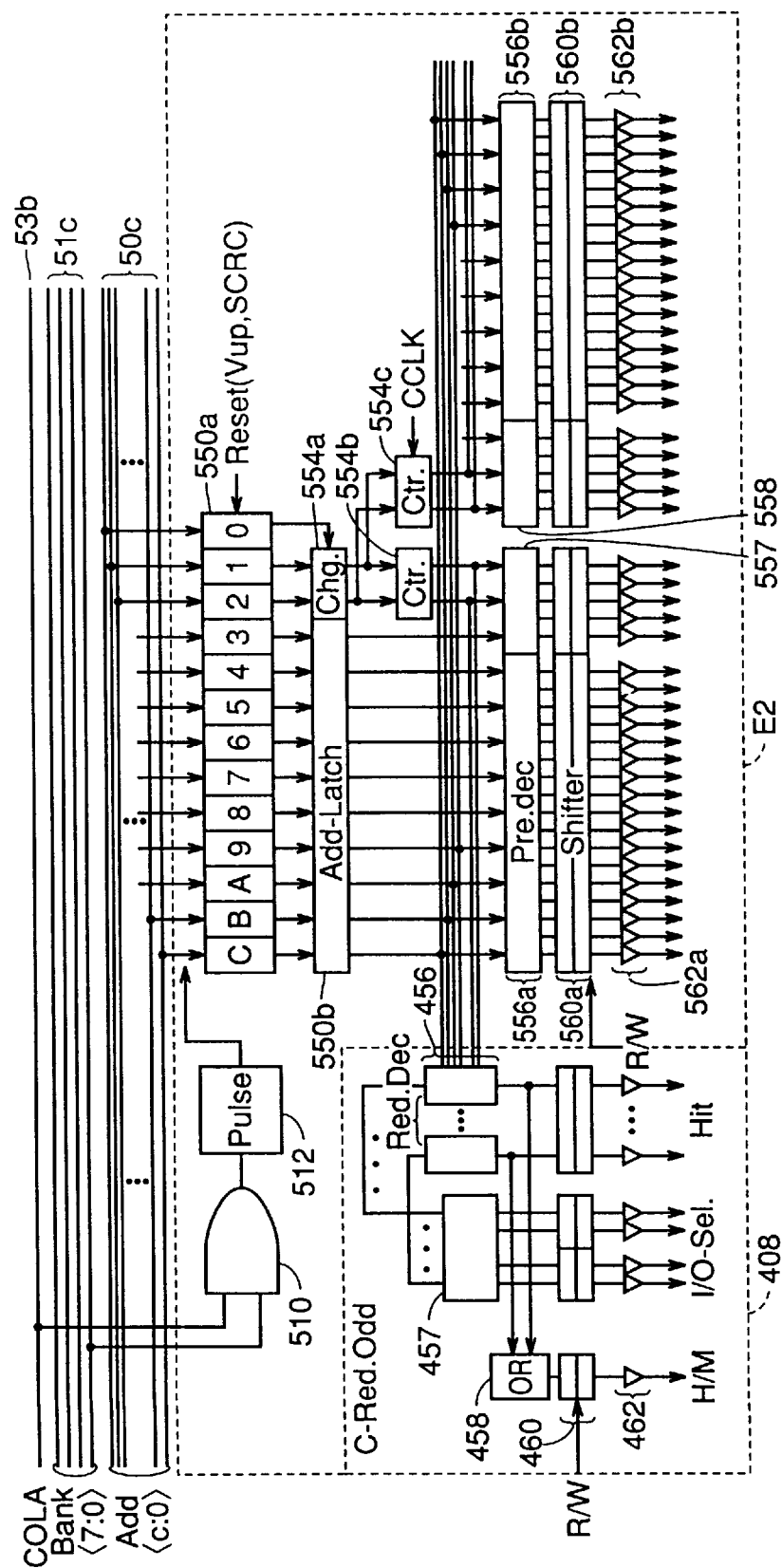
FIG. 10 is a schematic block diagram showing a structure including the control system of the redundant circuitry for a column related local control circuit.

FIG. 10 is a schematic block diagram showing a structure including the control system of the redundant circuit portion for the column related local control circuit of FIG. 9.

Referring to FIG. 10, address process unit E2 is a circuit to control the column select operation of region 100a1 corresponding to an even numbered address and region 100a2 corresponding to an odd numbered address. Redundancy determination unit 408 is a circuit to control the column determination operation of redundant region SR1.

Redundant region SR1 has a structure that allows redundancy replacement for both regions 100a0 and 100a1 corresponding to an even numbered address.

Address process unit E2 includes an AND circuit 510 receiving an access signal COLA to a column and a bank address signal, a pulse generation circuit 512 receiving the output of AND circuit 510 to generate a one shot pulse, a primary latch circuit 550a to input the 13-bit address Add (C:0) transmitted from the center through address bus 50c according to the output of pulse generation circuit 512, a latch circuit 550b for latching the column address output from primary latch circuit 550a, an address conversion circuit 554a for converting the least significant 3 bits in primary latch circuit 550a according to the operating condition, counters 554b and 554c (corresponding to burst address counter 1060) receiving the output of address conversion circuit 554a to count for a burst operation in synchronization with clock signal CCLK, predecoders 556a, 556b, 557 and 558 receiving the outputs of latch circuit 550b and counters 554b and 554c, shifters 560a and 560b for delaying the outputs of predecoders 556a, 556b, 557 and 558, drivers 562a and 562b for providing the outputs of shifters 560a and 560b to the memory array, and a redundancy determination unit 408 receiving the address signal latched by latch circuit 550b to carry out redundancy determination.

Signal CCLK is an inverted version of internal clock signal int.CLK. Counters 544b and 554c carry out a count-up operation during the inactive period of internal clock signal int.CLK.

Predecoders 556a and 556b, shifters 560a and 560b, and drivers 562a and 562b in FIG. 10 function to output a column select signal corresponding to odd numbered address region 100a2 to a predecode line.

Although only redundancy determination unit 408 corresponding to the even numbered address region is illustrated in FIG. 10, a structure similar to that of redundancy determination unit 408 is provided corresponding to odd numbered address region 100a2.

Redundancy determination unit 408 includes a redundancy determination circuit 456, an input/output select circuit 547 and OR circuit 458 receiving the output of redundancy determination circuit 456, a shifter 460 for delaying the outputs of redundancy determination circuit 456, input/output select circuit 457, and OR circuit 458, and a driver 462 to provide the output of shifter 460 to the memory array.

The operation will be described briefly now.

The address signal sent from the center portion of SDRAM 1000 is input into primary latch circuit 550a as the column address according to the output of pulse generation circuit 512 on the basis of access signal COLA and the bank address.

Primary latch circuit 550a is set by signal SCRC after the column address is output to latch circuit 550b and address generation circuit 554a. Primary latch circuit 550a is reset when the power is turned on according to a signal Vup that is generated only at the time of power on.

The least significant 3 bits of the column address relate to the process for a burst operation, and are applied to the counter after subjected to an address conversion process.

In practice, the least significant address is common since the odd numbered address and the even numbered address are processed at the same time. Two bits out of the least significant 3 bits are subjected to the counter process.

The result is transmitted to each predecoder in the odd numbered address region and even numbered address region of the memory array in the bank. When the column address is applied also to the redundancy determination circuit and replacement with a redundant memory column is carried out, the signal output from OR circuit 458 attains an active state. In response, the output from driver circuit 462 delayed by a predetermined time is recognized as a hit signal Hit designating replacement with a redundant memory column. When signal Hit is inactive, replacement with a redundant memory column is not carried out. This is referred to as a "miss" of the conversion to the redundant column. Therefore, the signal output from driver circuit 462 is generically called a hit/miss signal (H/M signal).

As described above, the determination result of the plurality of redundancy determination circuits provided corresponding to even numbered address portion 408 is ORed at OR circuit 458 to be recognized as the determination result of whether to effect a redundant replacement or not.

Input/output select signal I/O-Sel. output from input/output select circuit 457 via the shifter and the driver designates which of global I/O bus G-I/O is the data read out from main I/O line pair RM-I/O belonging to redundant region SR1 to be output.

[Details of centralized arrangement method of redundant memory cell column]

Figure 11:
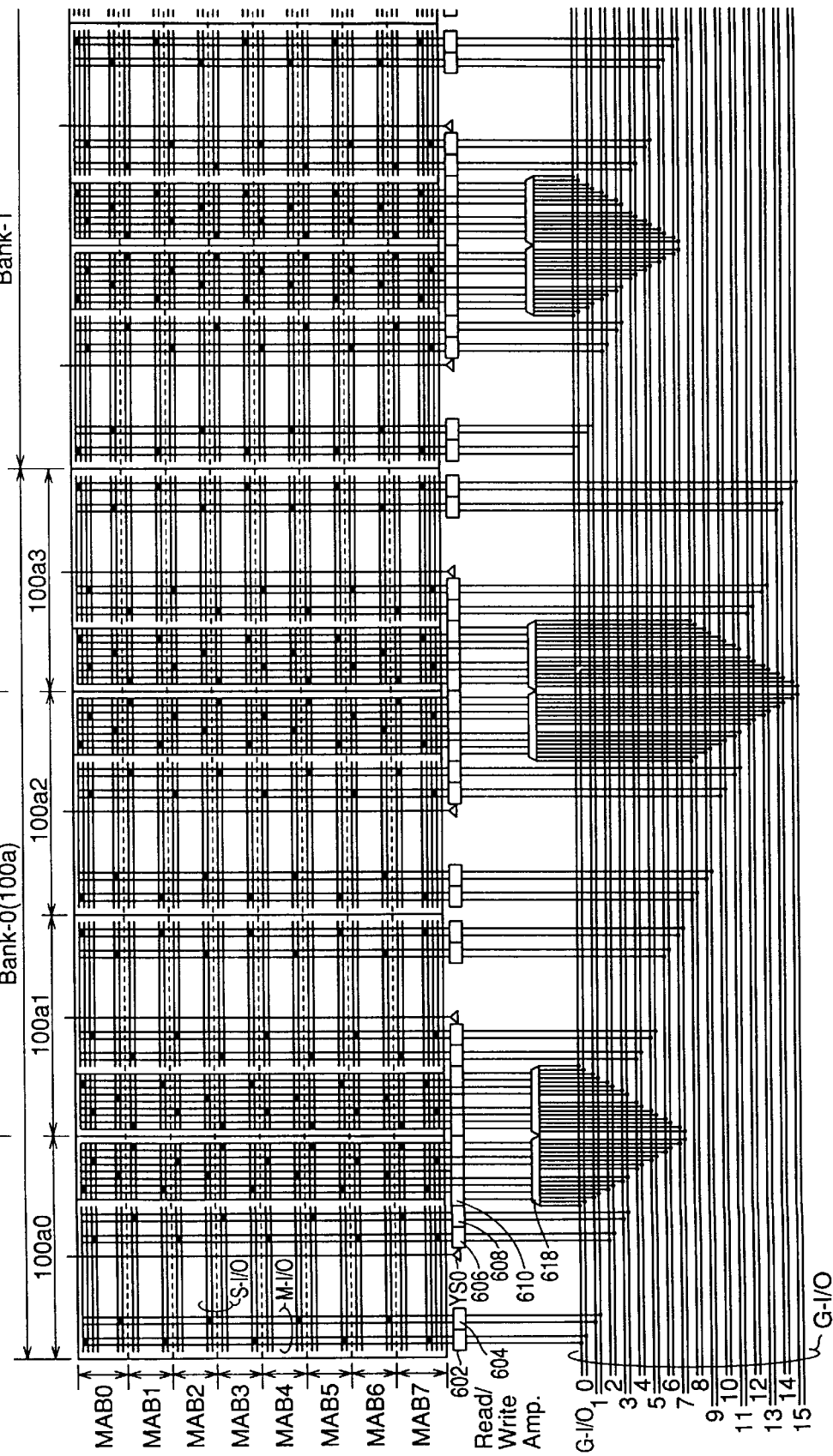
FIG. 11 is a schematic block diagram to describe the path of read out data transmitted to a global I/O bus G-I/O.

FIG. 11 is a schematic block diagram for describing the path through which the data read out from the regular memory cell column, redundant memory cell column, sub I/O line pairs S-I/O, RS-I/O and main I/O line pairs M-I/O, RM-I/O is transmitted to global I/O bus G-I/O.

The data read out in response to activation of column select signal YS0 corresponding to a regular memory cell column in region 100a0 is transmitted to read/write amplifiers 602, 604, 606 and 608 via main I/O line pair M-I/O and amplified. The amplified data is then transmitted to a corresponding global I/O bus G-I/O.

In contrast, the data read out via main I/O line pair RM-I/O provided corresponding to redundant column region (spare region) SR0 of region 100a0 is amplified by corresponding read/write amplifiers 610–616.

The data amplified by read/write amplifiers 601–616 is applied to multiplexer 618 to be transmitted to a predetermined data line pair of corresponding global I/O buses G-I/O according to signal I/O-Sel. described with reference to FIG. 10.

The data read out from the region of a regular memory cell column of region 100a0 is transmitted to global G-I/O line pairs G-I/O0–3.

In contrast, the data read out from redundant column region SR0 is transmitted to any of G-I/O line pairs 0–7 of the global I/O bus via multiplexer 618.

Since the data read out from the other even numbered address region 100a1 is transmitted to G-I/O line pairs G-I/O4–7 of the global I/O bus, spare region SR0 is replaceable with any of the regular memory cell column regions of 100a0 and 100a1. Therefore, the output from multiplexer 618 can be connected to all the G-I/O line pairs connected to regions 10Oa0 and 100a1.

Figure 12:
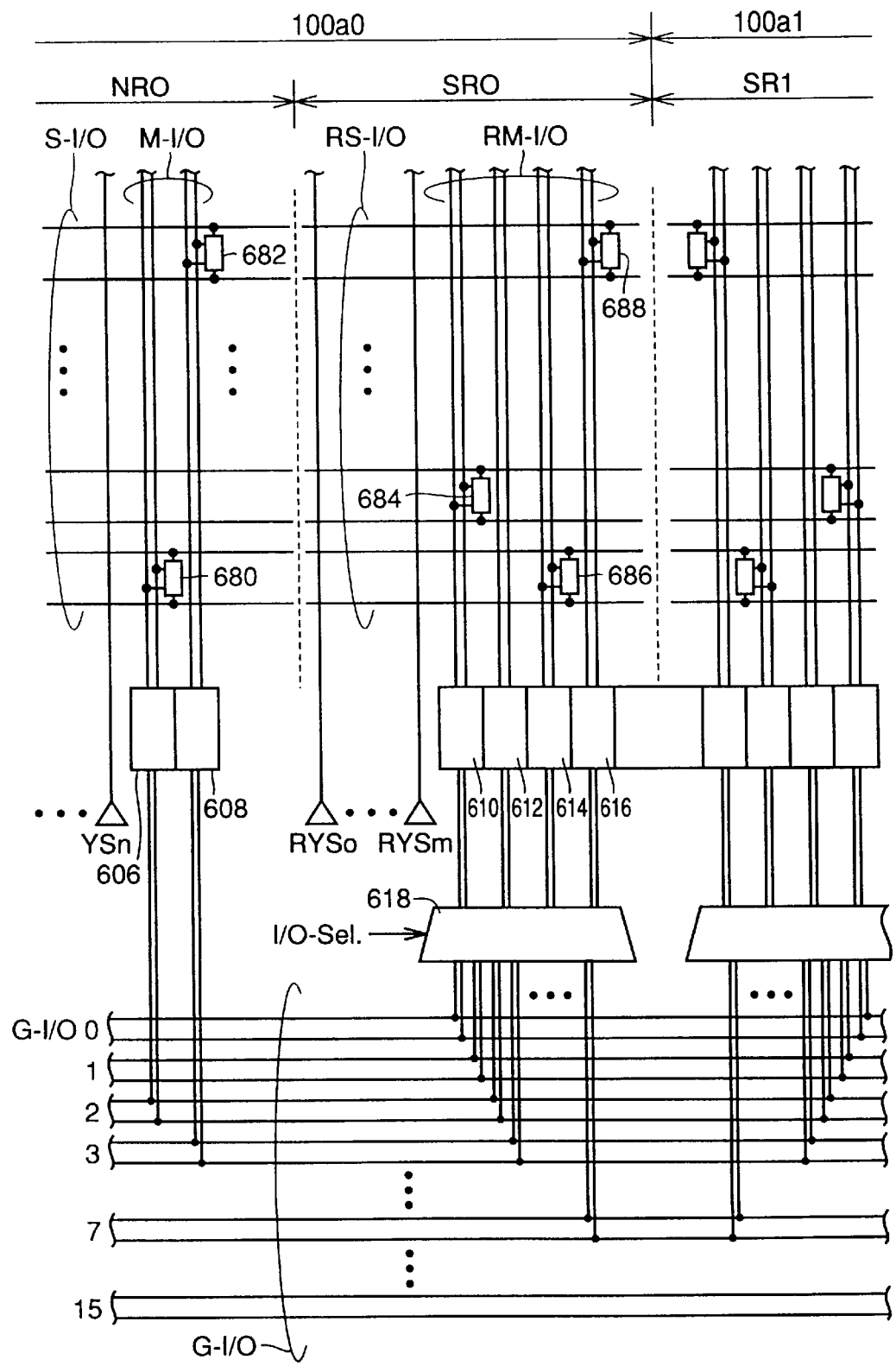
FIG. 12 is a block diagram showing in further detail the structure of the main amplifier and the multiplexer of FIG. 11.

FIG. 12 is a block diagram for describing in further detail the structure of main amplifiers 606, 608, 610–616 and multiplexer 618 of the structure of FIG. 11.

In regular memory cell column region NR0 in region 100a0, activation of one column select line YSn causes the data transmitted through sub I/O line pair S-I/O to be amplified by subamplifier 680. The amplified data is transmitted through main I/O line pair M-I/O to be amplified by main amplifier 606. Then the amplified data from main amplifier 606 is transmitted to G-I/O line pair G-I/O2 of the global I/O bus.

Similarly, data amplified by a subamplifier not shown is transmitted to main I/O line pair M-I/O and amplified by read/write amplifier 608 to be transmitted to G-I/O line pair G-I/O3.

When column select line RYSm in redundant memory cell column region SR0 of region 100*a*0 is activated, the data transmitted through sub I/O line pair RS-I/O is amplified by subamplifiers 684 and 686 to be transmitted to main I/O line pair RM-I/O.

Read/write amplifiers 610–616 respectively amplify the data read out from the four memory cells selected in response to activation of one column select line RYSm. The amplified data are applied to multiplexer 618.

Multiplexer 618 transmits the selectively read out data to any of G-I/O lines G-I/O0 to G-I/O7 according to signal I/O-Sel.

As described above, data read out from regular memory cell column region NR0 of region 100*a*0 of bank 0 is read out to G-I/O line pairs G-I/O0–3, whereas data read out from regular memory cell column region NR1 (not shown) of region 100*a*1 is output to G-I/O line pairs G-I/O4–7. By such a structure, the redundant column in redundant memory cell column region SR0 belonging to region 100*a*0 can replace any of the regular memory cell columns in regions NR0 and NR1.

Figure 13:
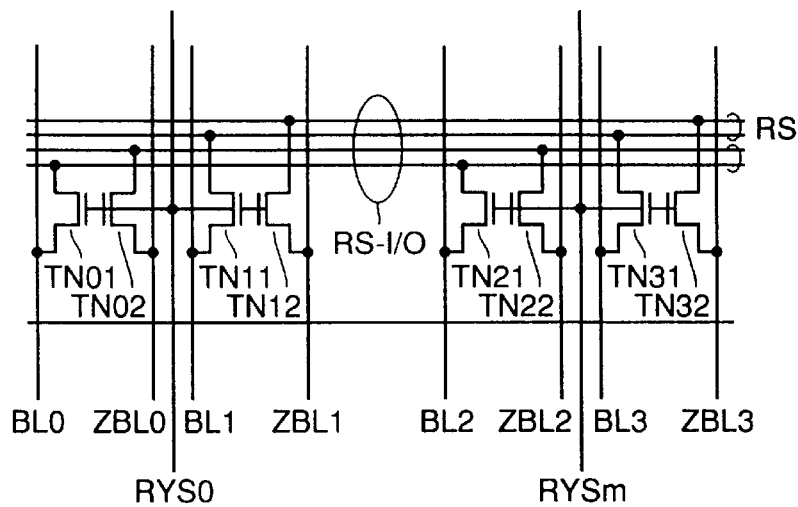
FIG. 13 is a circuit diagram showing a structure of a transfer gate portion for transmitting data from a selected bit line pair to a sub I/O line pair RS-I/O.

FIG. 13 is a circuit diagram showing a structure of the transfer gate portion to transmit data from a selected bit line pair to a sub I/O line pair RS-I/O in redundant memory cell column region SR0.

In FIG. 13, only the structure of the area connected to two sub I/O line pairs RS-I/O corresponding to two memory cell columns by one column select line is illustrated.

It is to be noted that, in practice, four bit line pairs are connected to the corresponding four sub I/O line pairs RS-I/O by the activation of one column select line.

When column select line RYS0 is rendered active, the pair of bit lines BL0 and ZBL0 are connected to sub I/O line pair RS-I/O0 via transfer gate transistors TN01 and TN02, respectively.

In contrast, the pair of bit lines BL1 and ZBL1 are connected to sub I/O line pair RS-I/O1 via transfer gate transistors TN11 and TN12, respectively, when column select line RYS0 is rendered active.

Figure 14:
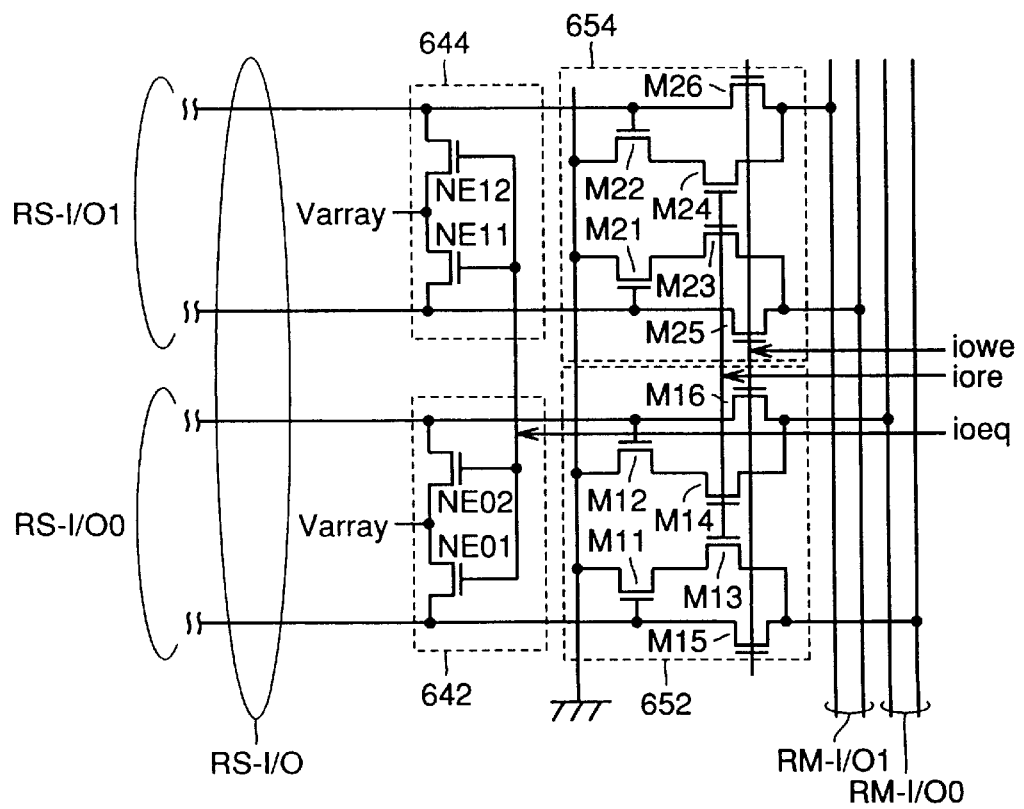
FIG. 14 is a circuit diagram showing a structure of equalize circuits 642 and 644, and subamplifiers 652 and 654.

FIG. 14 is a circuit diagram showing a structure of equalize circuits 642, 644 and subamplifiers 652 and 654 provided at the crossings between sub I/O line pairs RS-I/O0 and RS-I/O1 and corresponding main I/O line pairs RM-I/O0 and RM-I/O1.

Equalize circuit 642 and subamplifier 652 are provided corresponding to sub I/O line pair RS-I/O0. Equalize circuit 644 and subamplifier 654 are provided corresponding to sub I/O line pair RS-I/O1. Equalize circuit 642 includes N channel MOS transistors NE01 and NE02 connected in series between sub I/O line pair RS-I/O0 and rendered conductive by signal ioeq. Precharge potential Varray is supplied to the connection node of transistors NE01 and NE02.

Precharge potential Varray has a level reduced from the level of the external power supply potential to be supplied to the memory cell array.

Subamplifier 752 includes N channel MOS transistors M11 and M12 having respective sources receive the ground potential and respective gates connected to respective I/O lines of a corresponding sub I/O line pair, and N channel MOS transistor M13 and M14 connected between the drains of transistors M11 and M12 and the I/O line of a corresponding main I/O line pair RM-I/O0, and having a gate potential controlled by signal iore.

More specifically, when transistors M13 and M14 are rendered conductive by signal iore, the potential level of either line in main I/O line pair RM-I/O0 is pulled down to the level of the ground potential according to the potential level of sub I/O line pair RS-I/O0.

Thus, the data transmitted through a sub I/O line pair is transmitted to the main I/O line pair in a readout operation.

Subamplifier 752 further includes transistors M15 and M16 connected between sub I/O line pair RS-I/O0 and main I/O line pair RM-I/O0, and having a gate potential controlled by signal iowe.

More specifically, transistors M15 and M16 are rendered conductive in response to activation of signal iowe so that sub I/O line pair RS-I/O0 and main I/O line pair RM-I/O0 are directly connected in a write operation.

A similar structure is provided corresponding to sub I/O line pair RS-I/O1 and main I/O line pair RM-I/O1.

Figure 15:
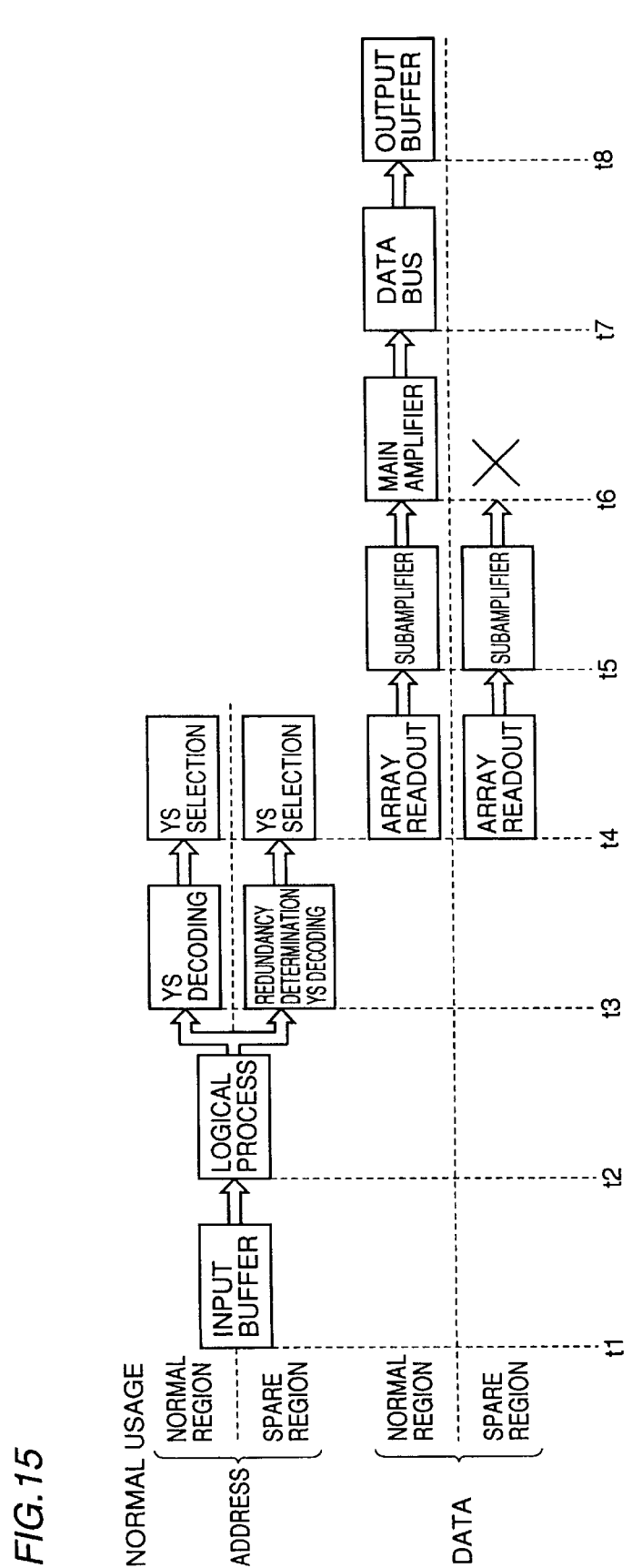
FIGS. 15 and 16 show the process flow from application of an external address signal up to application of data to an output buffer when a regular memory cell column and a redundant memory cell column, respectively, are selected.
Figure 16:
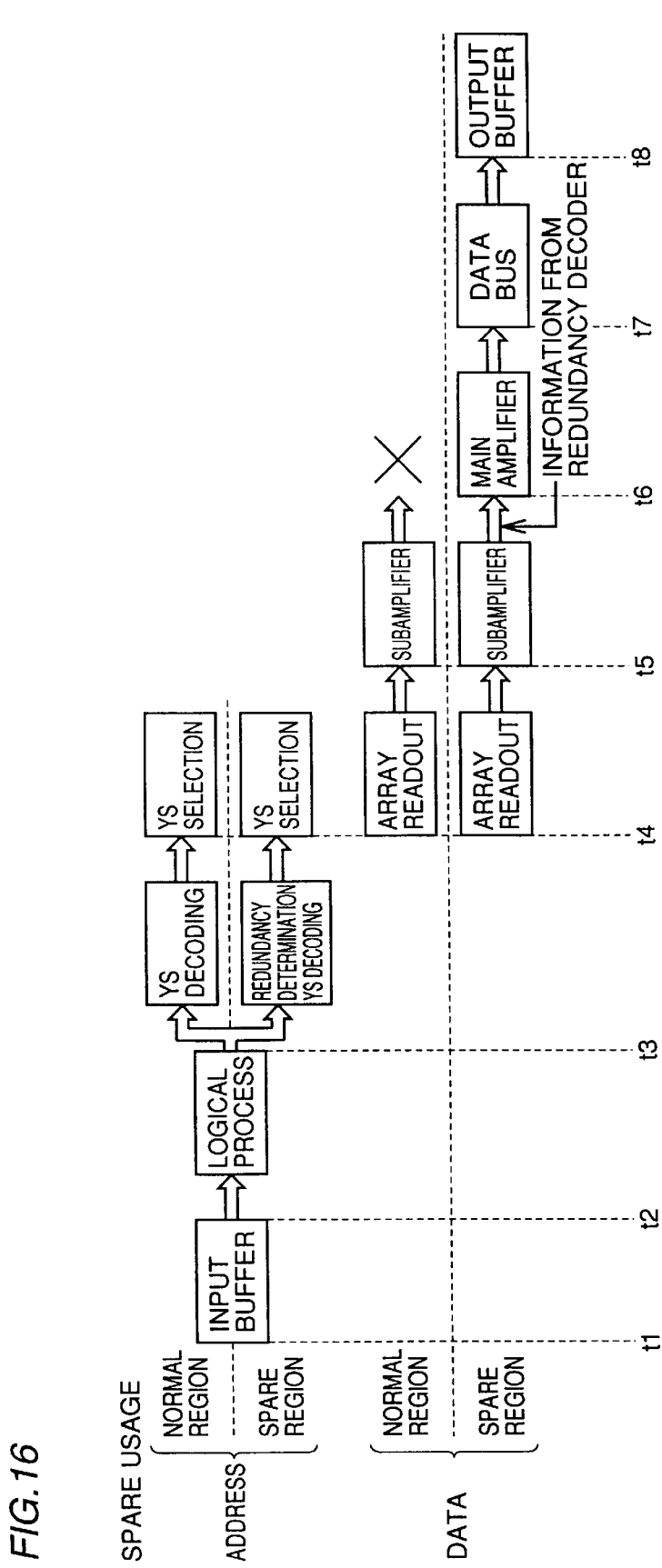

FIGS. 15 and 16 show the process flow from the input of an external address signal up to the output of data to an output buffer according to the arrangement of the redundant memory cell column of FIG. 11, the former corresponding to selection of a regular memory cell column and the latter corresponding to the selection of a redundant memory cell column.

At time t1, an address signal is applied to the address input buffer. At time t2, the address signal transmitted through address bus 50*c* is input to primary latch 550*a*. In address conversion circuit 554*a*, the logical process of determining whether the input address signal is an even numbered address or an odd numbered address, and for determining the memory cell column that is to be selected according to the burst length and the burst mode is initiated.

At time t3, the decoding process of a column address in predecoder 556 is initiated in the region corresponding to the regular memory cell column. Simultaneously at time t3, the redundancy determination process and decoding process with respect to the redundant memory cell column to be selected are initiated in the redundancy determination unit.

At time t4, a corresponding column select line is rendered active in both the regular memory cell column and the redundant memory cell column. In response, data from a selected memory cell is transmitted to a sub I/O line pair.

At time t5, the subamplifier is rendered active according to the selection of a redundant column at time t4 in both the regular and redundant memory cell columns to transmit the data to a corresponding main I/O line pair.

At time t6, the data transmitted by the main I/O line pair is amplified by a read/write amplifier (main amplifier). Here, in response to selection of a regular memory cell column, only the read/write amplifier corresponding to the regular memory cell column is rendered active. The read/write amplifier corresponding to the redundant memory cell column is not rendered active.

When a redundant memory cell column is selected as in FIG. 16, the read/write amplifier corresponding to the regular memory cell column is not activated. Only the read/write amplifier corresponding to the redundant memory cell column is rendered active.

Then, data is transmitted to a corresponding global I/O bus G-I/O by the activated read/write amplifier, whereby data is output from an output buffer.

According to the above-described structure, the decoding process and redundancy determination process with respect to the column address supplied at time t1 are carried out in parallel for both the corresponding regular and redundant memory cell columns. Therefore, the time from t1 where a column address signal is applied to time t4 where a column select line select operation is carried out is shorter than the time from t1 to t3 of FIGS. 5 and 6.

In the foregoing, a structure was described in which data read out from the regular and redundant memory cell columns is amplified in parallel by a subamplifier. A structure is also applicable in which the column select line of the memory cell column that is not used is returned to its inactive state during transition to activation by the result of the redundancy repair determination, i.e., a structure in which driver circuits 562a and 562b are controlled by signal H/M.

Such a structure allows unnecessary power consumption to be suppressed that is caused by activation of a subamplifier and the like.

Figure 17:
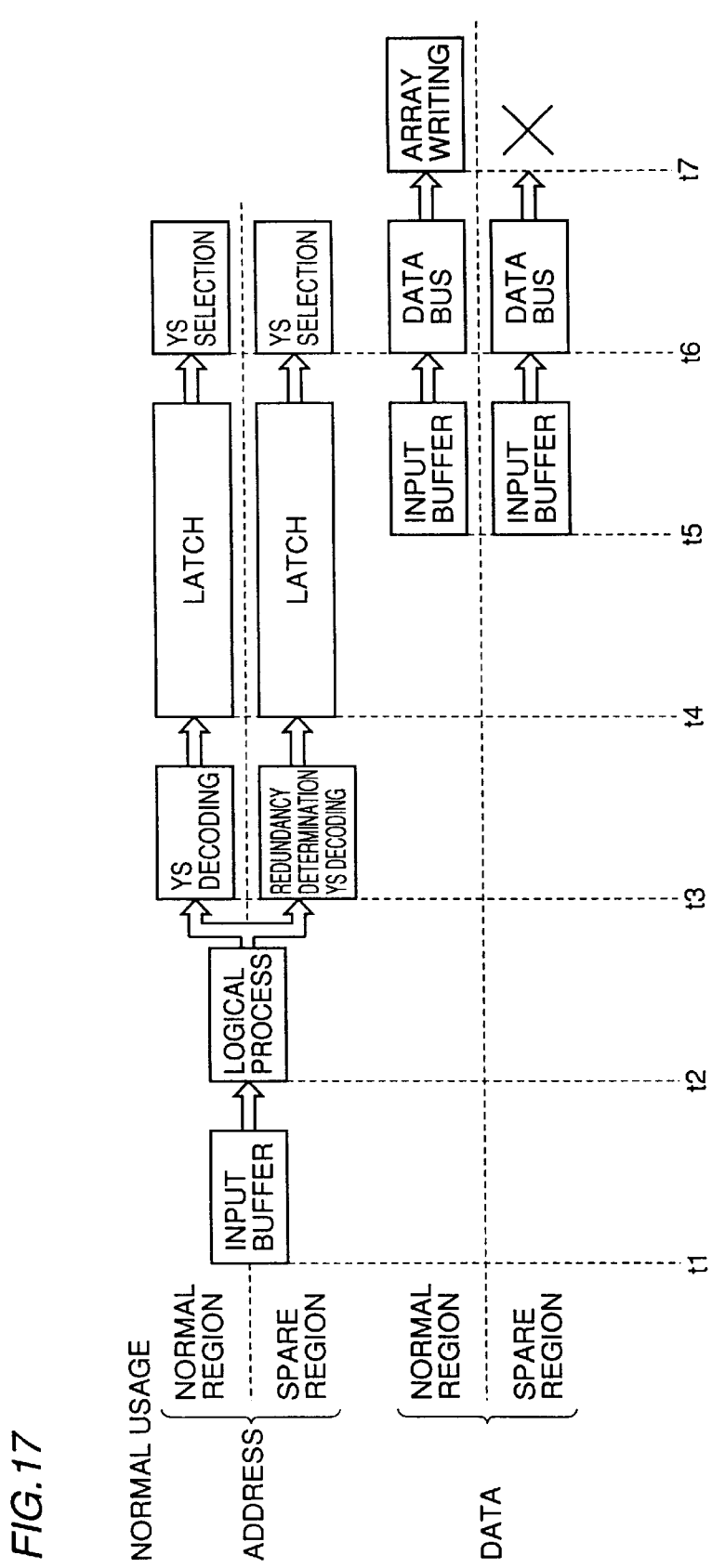
FIGS. 17 and 18 show the process flow of data written into a memory cell array after an external column address signal is applied when a regular memory cell column and a redundant memory cell column, respectively, are selected.
Figure 18:
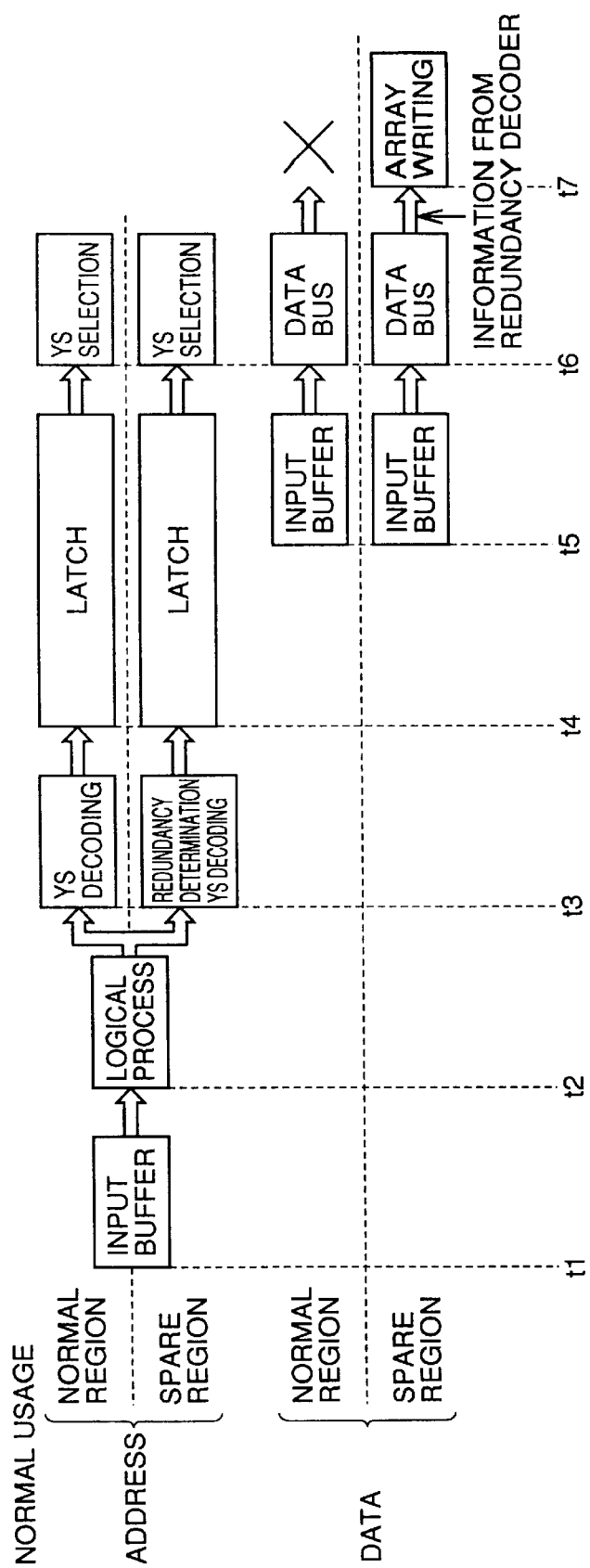

FIGS. 17 and 18 shows a process flow from the input of an external column address signal to the output of data to a memory cell array, the former corresponding to selection of a regular memory cell column and the latter corresponding to the selection of a redundant memory cell column.

At time t1, a column address signal is applied to the address input buffer. At time t2, a logic process of converting the address is carried out according to whether the applied column address is an even numbered address or an odd numbered address.

At time t3, a decoding process of a column address by a predecoder is carried out in the regular memory cell column region in parallel to the redundancy determination process and memory cell column decoding process in the redundant memory cell column region. The decoded column address data is applied to shift circuit 560. The value is latched in shifter 560 for a period of time of the clock cycle corresponding to the CAS latency in the write operation mode.

At time t5 in a CAS latency cycle, write data is applied to data input/output terminal 1070.

At time t6, a corresponding column select signal is rendered active in both the regular and redundant memory cell column regions according to the column address signal latched at shifter 560.

The write data input at time t5 is transmitted through the global I/O bus up to a corresponding read/write amplifier.

At time t7, when the regular memory cell column is selected as shown in FIG. 17, only the main amplifier corresponding to the regular memory cell column is rendered active. In response, data is written only to the regular memory cell column. Data is not written into the redundant memory cell column region.

In contrast, when a redundant memory cell column is selected as shown in FIG. 18, only the read/write amplifier corresponding to the redundant memory cell column is rendered active. Data is written only to the redundant memory cell column.

As to the input of an address and data in a write operation, first the address is input corresponding to the column to be selected. Following the process of a system external to the chip, data is input to the chip behind the address signal.

This delay of the data to the chip is effected intentionally by the system or inevitably due to usage of the external bus of the chip.

The logic conversion with respect to the column address, the process of generating a burst address, the process of redundancy determination for defective repair and the like are carried out according to the address signal that is input prior to the data signal.

When the decoding process to render a column select line active is carried out and all these processes are completed, the column address data is retained in a latch during the standby for the arrival of the data signal.

The data signal is distributed to the memory array along the data bus when input to the chip. The decoding data of the column address retained in the latch renders the selected column select line active in accordance with the data arrival, whereby data is written into a memory cell.

By the latency of a predetermined cycle time during the period of time from column address data input to write data output allows a write operation to be carried out efficiently without being limited by the operating frequency.

The operation speed is determined by the time for an externally applied data to be transmitted to the array. The write operation speed will not be rate-determined by the time for redundancy repair determination and the propagation of that address signal. More specifically, when the data is transmitted to a read/write amplifier from a global I/O bus G-I/O, the multiplexer of the redundant area is already rendered active. The write operation speed is rate-determined only by the transportation time of the data from the input buffer to the memory cell array.

Both the regular memory cell column region and the redundant memory cell column region have the column select line rendered active substantially simultaneously through the same process up to the selection of a column select signal. In practice, it is desirable to return the column select line of the side not used to an inactive state during the transition to activation according to the result of the redundancy repair determination, or set the select line of the non-used side inactive taking advantage of the CAS latency period in the write operation. This provides the advantage that unnecessary power is not consumed.

When the regular memory cell column region is proper and the operation of the read/write amplifier of the redundant column region is rendered inactive, data is not written to the redundant column region. In other words, data is not transmitted to main I/O line pair M-I/O.

It is to be noted that a structure in which the activation operation of a column select line itself is not carried out. When there is a defect in the regular memory cell column region and must be replaced with a redundant memory cell column region, the operation of the read/write amplifier of the regular memory cell column region is rendered inactive, so that no data is written into the regular memory cell column region. Here, signal I/O-Sel. determining the connection path of multiplexer 618 and the like is generated according to the result of the redundancy repair determination.

Figure 19:
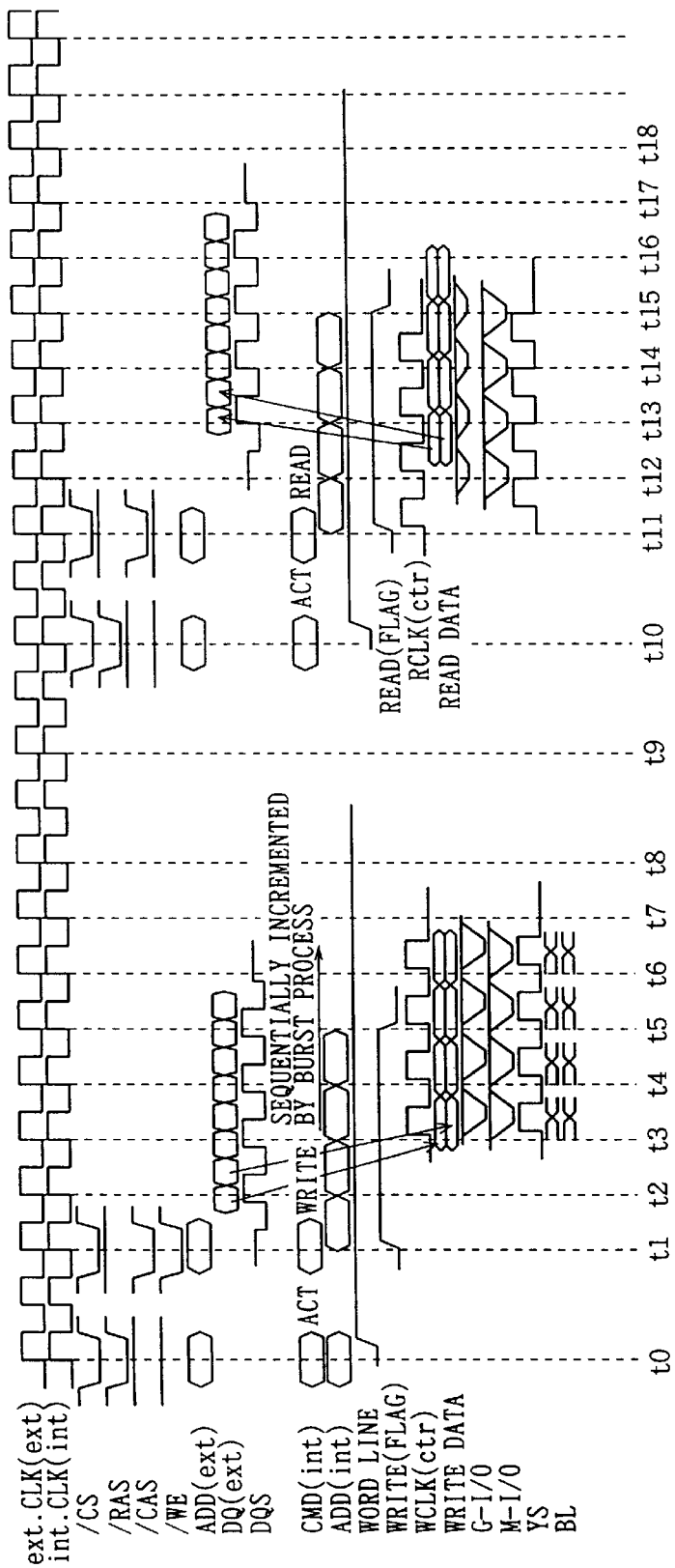
FIG. 19 is a timing chart for describing a write operation and a read operation.

FIG. 19 is a timing chart for describing the write and read operations of FIGS. 15 and 18.

FIG. 19 corresponds to an operation where the burst length is 8 and the CAS latency of the read operation is 2.

A CAS latency of 2 implies that data output is initiated at the second clock from the input of a command.

[Write operation in DDR-SDRAM mode]

Referring to FIG. 19, activation of the SDRAM is designated in response to active signals /CAS and /RAS at the rising edge of external clock signal ext.CLK at time t0.

At time t0, a column address and a bank address are input and retained in row address latch 250 and bank address latch 1052, respectively.

At time t1, a write operation is specified when signals /CS, /CAS and /WE are at an active state at the edge of the activation of internal clock signal int.CLK. Here, the column address is retained in column address latch 550. By specifying a burst write operation mode, the write operation in subsequent cycles will proceed while automatically incrementing the column address in SDRAM 1000 by burst test counter 1060.

In response to specification of a write operation, flag signal WRITE designating an internal write operation is driven to an active state. Then, by altering the external write data in synchronization with signal DQS applied to SDRAM 1000, the next write data is input.

The data written in series is converted into parallel data for every two bits at data input/output circuit 1086 to be written into a selected memory cell at time t4–t6 subsequent to time t3.

[Readout operation in DDR-SDRAM mode]

At time t10 in a readout operation, an ACT command to render a word line active is input when signals /CS and RAS are at an active state at the rising edge of external clock signal ext.CLK. At this time point, an address that specifies a word line is also input.

At time t11, a readout operation is specified according to the active states of signals /CS and /CAS. Here, a column address is specified and maintained in column address latch 550. Burst address counter 1060 generates an internal address according to the column address retained in column address latch 550. A relevant word line is rendered active and 2 bits are read out in parallel from the selected memory cell. The data amplified by the sense amplifier is read out in synchronization with a readout clock RCLK generated in SDRAM 1000.

The data of 2 bits read out in parallel are retained in data input/output circuit 1086 and converted into serial data to be sequentially output from time t13 through data input/output terminal 1070.

When a burst readout operation mode is specified, the readout operation subsequent to time t14 proceeds to read out 2 bits in parallel and subsequently convert the data into serial data while automatically incrementing the column address internally to output the data through data input/output terminal 1070.

Here, signal DQS is output from SDRAM 1000 in synchronization with the data output to provide the data output timing.

In a column related access, an address signal is input to column address latch 550. The changing manner of the column address in a burst operation is classified into an interleave method and a sequential method. The selection of either method is stored as operation information in mode register 1046 by a combination of the address signals. The operation of a burst address counter 1060 differs under control of mode register 1046.

In a DDR-SDRAM operation mode, data must be output two times in one cycle of an external clock signal. Therefore, the internal circuitry in the DDR-SDRAM operation mode operates to read out two data from the selected memory array block in one clock cycle. This means that the address signal output from burst address counter 1060 must generate two addresses at one time to read out the two data.

Here, there was a problem that generation of a burst address cannot be carried out by simply incrementing the input address sequentially since the externally applied column address signal can be either an even numbered or odd numbered address at the initial state of the burst address.

For example, even if 1 is input as an external column address signal, the pair of internal column address signals to be generated is (1, 2) for a sequential mode and (1, 0) for an interleave mode.

This means that the place where column selection is carried out with the even numbered address differs from the place where the column selection (column of activated column select signal) with the corresponding odd numbered address.

Therefore, SDRAM 1000 has a structure in which each memory cell array block is divided into a region corresponding to the even numbered address and a region corresponding to the odd numbered address to separate the decoder for the column select signal corresponding to the even numbered address and the odd numbered address for independent operation.

For example, the memory array block of memory cell array bank 0 is divided into regions 100a0 and 100a1 corresponding to the even numbered address and regions 100a2 and 100a3 corresponding to the odd numbered address.

In view of the foregoing, the write operation and read operation in a DDR-SDRAM operation mode are as set forth in the following.

The address signal in the first column access cycle has the intact input value transmitted to column predecoders 556, 557 and 558.

At the next burst cycle, respective processes corresponding to the address counter for an even numbered address and the address counter for an odd numbered address are carried out. Then, the processed signals are transmitted to column related predecoders 556, 557 and 558.

When operating as a DDR-SDRAM, the data input operation is carried out in synchronization with an externally applied DQS clock for bidirectional synchronization (referred to as bidirectional mode hereinafter).

The data output operation is carried out in synchronization with a synchronizing signal generated by internal control clock generation circuit 1008 in SDRAM 1000.

In a write operation, a command and a first address are input. The data signal is input slightly behind the command and the first address at a frequency two times that of the external clock. This delay with respect to an external clock is of no problem as long as data is input according to the timing of an externally applied DQS clock.

Upon recognition of a write command input, mode decoder 20 renders write flag WRITE active. A write clock signal WCLK is generated corresponding to internal clock signal int.CLK1 from internal control clock generation circuit 18. Since data input is slightly delayed, the write clock signal must also be delayed correspondingly.

In FIG. 19, the write clock signal is rendered active at a phase 2 clock signals behind the external clock signal taking into account a slight margin. The write data input through data input/output terminal 1070 to data input/output circuit 1086 in synchronization with internal clock signal int.CLK at a frequency two times that of the external clock signal is transmitted via global int.CLK bus G-I/O and arrayed main I/O line pair M-I/O two bits at a time (for the odd numbered address and even numbered address) in synchronization with write clock signal WCLK.

By the activation of the column select signal corresponding to a predetermined column in the selected memory array block, data is written into a memory cell via the selected bit line pair. From the second access and et seq. of the burst cycle, an internal column address signal that is altered according to the burst method is output from burst address counter 1060, whereby data is written for every 2 bits in accordance with write clock signal WCLK.

When a command and a first address are input and recognized by mode decoder 20 in a read operation, mode decoder 20 renders read flag READ active. In response, a read clock signal RCLK is generated in response to internal clock signal int.CLK2 output from internal control clock generation circuit 18 having a frequency identical to that of the external clock signal. Column select signal YS is rendered active according to read clock signal RCLK, whereby data of 2 bits (even numbered address group and odd numbered address group) are read out simultaneously from the sense amplifier.

The read out data of 2 bits is transmitted and latched in data input/output circuit 1086 as the read data via main I/O line pair M-I/O and global I/O bus G-I/O. When the data of 2 bits applied in parallel are converted serially in data input/output circuit 1086, the converted data is output at a clock timing slightly earlier than the CAS latency timing in synchronization with internal clock signal int.CLK1 output from internal control clock generation circuit 18 and changing at a frequency two times that of the external clock signal.

In the second access and et seq. of the burst cycle, an internal column address signal that changes according to the burst address method is output from burst address counter 1060. Accordingly, data is sequentially read out from a memory cell block (bank) selected according to read clock signal RCLK.

Figure 20:
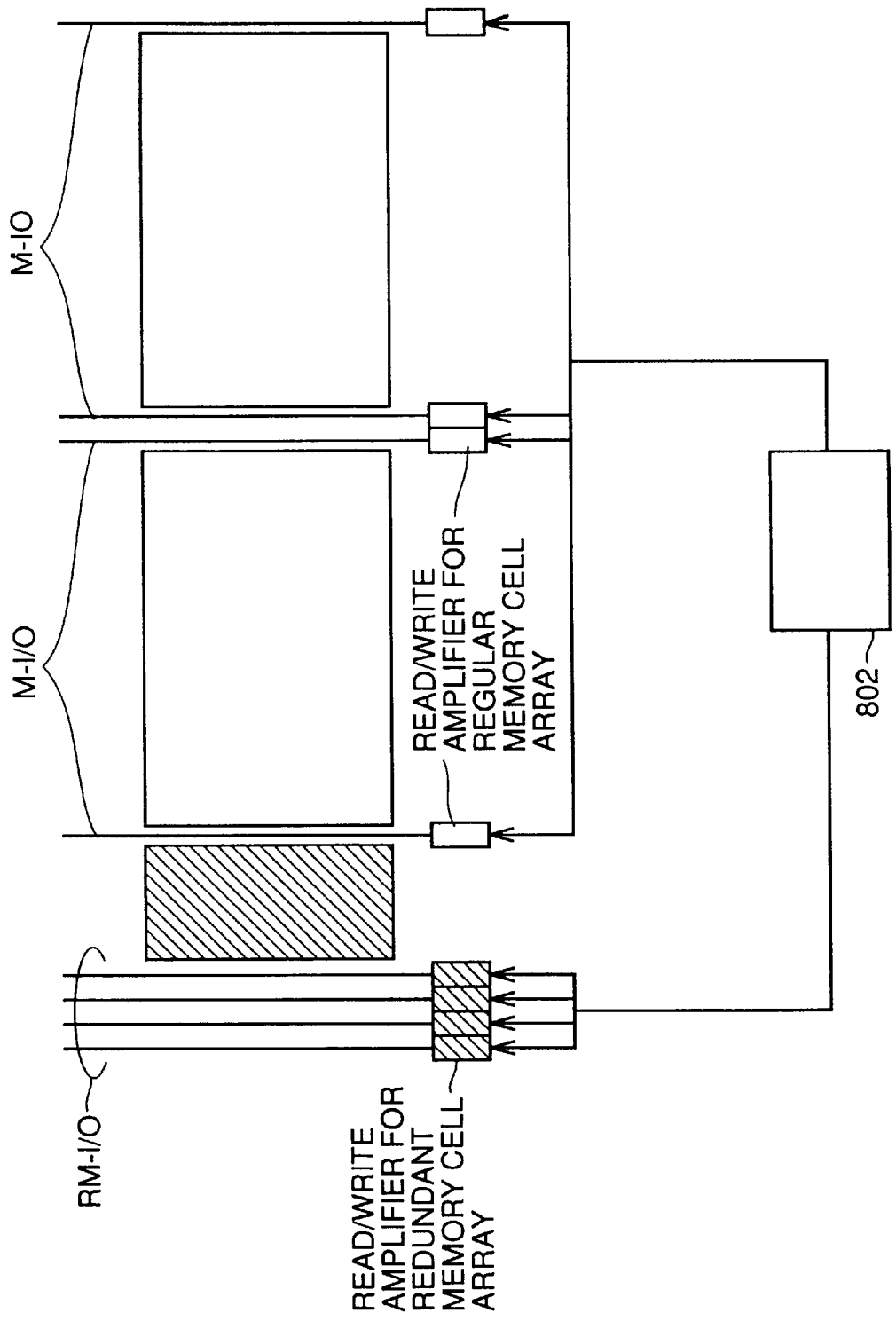
FIG. 20 is a schematic block diagram showing a structure of controlling a read/write amplifier.

FIG. 20 is a schematic block diagram showing a structure of controlling the read/write amplifier.

The read/write amplifiers for the regular memory cell block and the redundant memory cell block are respectively rendered active/inactive according to the main amplifier activation signal output from main amplifier control circuit 802.

Figure 21:
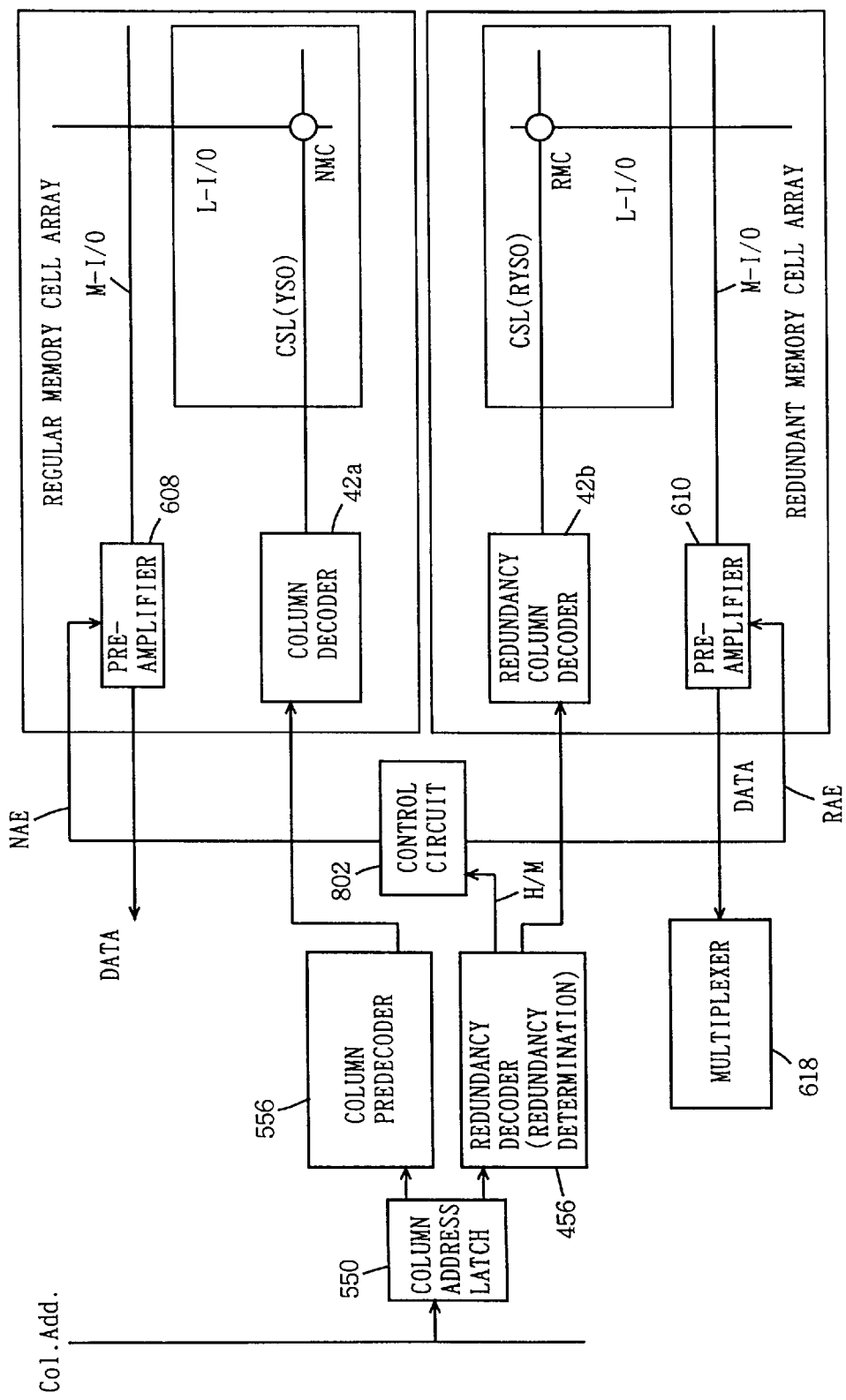
FIG. 21 is a block diagram showing a structure of a column select circuit when a redundant column is arranged in a centralized manner.

FIG. 21 corresponding to FIG. 4 is a schematic block diagram showing the structure of a column select circuit when the redundant column is arranged centralized as described above.

Column address signal Col.Add. transmitted through the address bus is input and retained in column address latch 550, similarly as in FIG. 4. Then, according to column address signal Col.Add. from column address latch 550, the address signal predecoded by column predecoder 556 is applied to column decoder 42a corresponding to the regular memory cell array.

Column address signal Col.Add. from column address latch 550 is also applied in parallel to redundancy decoder 456. Redundancy decoder 456 predecodes column address signal Col.Add. to apply the predecoded signal to redundant column decoder 42b, and also determines whether column address signal Col.Add. matches the address of the preprogrammed defective memory cell column in parallel to the predecoding operation.

Therefore, the activation of corresponding column select lines YS0 and RYS0 is initiated substantially at the same time for both the regular memory cell array and the redundant memory cell array. Hit miss signal H/M indicating the determination result from redundancy decoder 456 is output to control circuit 802 of the preamplifier.

When redundancy decoder 456 determines that column address signal Col.Add. matches the address of the defective memory cell column, control circuit 802 renders inactive regular preamplifier activation signal NAE applied to preamplifier 608 corresponding to the regular memory cell array, and also renders active redundant preamplifier activation signal RAE applied to preamplifier 610 corresponding to the redundant memory cell array. Accordingly, the data transmitted from the memory cell RMC in the redundant memory cell array through local (sub) I/O line pair L-I/O and main I/O line pair M-I/O is further applied to an output buffer (not shown) via preamplifier 610, multiplexer 618, and global I/O line pair G-I/O.

When redundancy decoder 456 determines that column address signal Col.Add. does not match the address of the defective memory cell column, the data read out from the regular memory cell NMC corresponding to column select signal YS0 selected by column decoder 42a and activated is transmitted to the output buffer (not shown) via local I/O line pair L-I/O, main I/O line pair M-I/O, preamplifier 608, and global I/O line pair G-I/O.

According to the above structure, the local I/O line pair L-I/O, main I/O line pair M-I/O, and the preamplifier portion are provided independently for the regular memory cell array and the redundant memory cell array. Therefore, control signals NAE and RAE of preamplifiers 608 and 610, respectively, are generated independently by control circuit 802 according to the determination result of redundancy decoder 456. However, the signal to designate the determination result of which of the regular memory cell array side or the redundant memory cell array side the column select line is to be activated is not required. In other words, the activation operation of a column select line is speeded than the case of FIG. 4.

Figure 22:
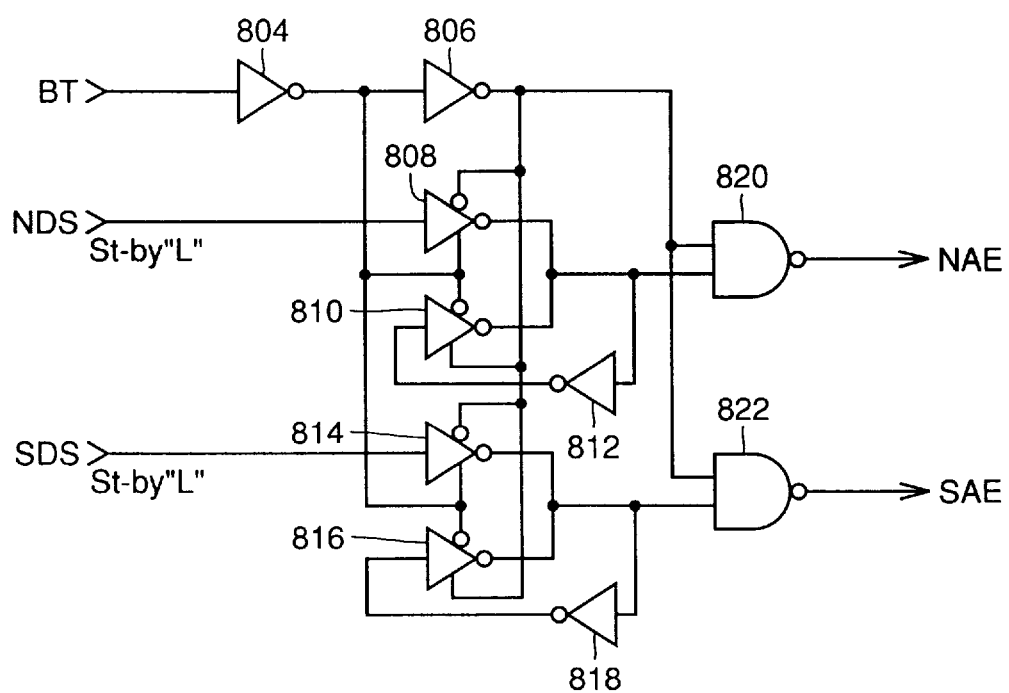
FIG. 22 is a schematic block diagram showing a structure of a main amplifier control circuit 802 of FIG. 20.

FIG. 22 is a block diagram showing a structure of a main amplifier control circuit 802 of FIG. 20.

The operation of main amplifier control circuit 802 is controlled according to write clock signal WCLK or read clock signal RCLK generated according to internal clock signal int.CLK.

Signal WCLK and signal RCLK will be referred generically as a base timing signal BT hereinafter to explain the operation common to both a read operation and a write operation.

Main amplifier control circuit 802 includes an inverter 804 receiving base timing signal BT, an inverter 806 receiving the output of inverter 804, a clocked inverter 808 receiving a normal deselect signal NDS attaining an L level in a standby state and attaining an H level when hit signal Hit is activated under control of the outputs of inverters 804 and 806, and clocked inverters 810 and 812 receiving the output of clocked inverter 808 to form a latch circuit.

Main amplifier control circuit 802 further includes a clocked inverter 814 receiving a spare deselect signal SDS attaining an L level in a standby state and attaining an active state when hit signal Hit is at an inactive state under control of the output signals of inverters 804 and 806, a clocked inverter 816 and an inverter 818 forming a latch circuit to receive and latch the output from clocked inverter 814, a NAND circuit 820 receiving the outputs of inverter 806 and clocked inverter 810, and a NAND circuit 822 receiving the outputs of clocked inverter 806 and clocked inverter 816.

A main amplifier activation signal NAE to activate a corresponding main amplifier in the regular memory cell column region is output from NAND circuit 820. A signal SAE activating the main amplifier of a redundant memory cell column region is output from NAND circuit 822.

When a redundant memory cell column is selected in the above-described structure, the main amplifier of the regular memory cell column side is not rendered active. In contrast, when the regular memory cell column is selected, the main amplifier of the redundant memory cell column side is not rendered active.

In the above structure in which a column select line is rendered active to reduce the delay in column access in both the redundant memory cell column and the regular memory cell column as shown in FIG. 11, either data can be selected to be output outside of the chip by selecting whether to amplify the data from the regular memory cell column or redundant memory cell column through the main I/O line pair in the main amplifier.

The above structure provides the advantage that the time required from input of an external address data up to read out of data can be reduced even in the case where the replacement operation with a redundant memory cell column is carried out.

Furthermore, a flexible replacement operation can be carried out since the replaceable range between the redundant memory cell column and the regular memory cell column is relatively broad.

Second Embodiment

Figure 23:
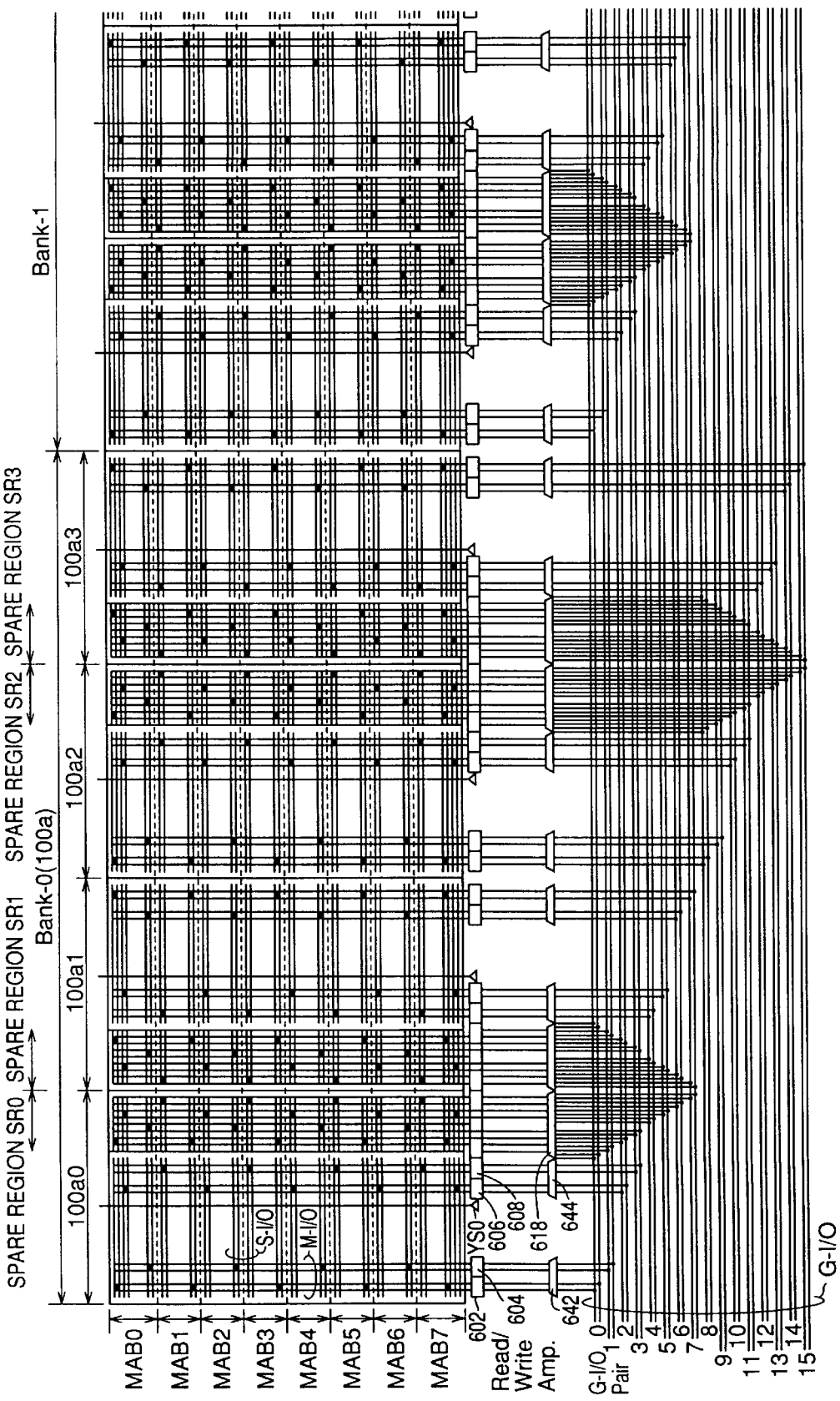
FIG. 23 is a schematic block diagram showing a structure of a sub I/O line pair, a main I/O line pair, and a global I/O line pair G-I/O of a second embodiment of the present invention.

FIG. 23 is a schematic block diagram showing a structure of a sub I/O line pair, a main I/O line pair, a main amplifier, a multiplexer, and a global I/O line pair G-I/O according to a second embodiment of the present invention.

The structure of FIG. 23 is comparable to the structure of FIG. 11. The structure of FIG. 23 differs from the structure of FIG. 11 in that a multiplexer 644 is provided in the path from main amplifiers 602–608 corresponding to the regular memory cell column to the global I/O bus in, for example, region 100a0.

The remaining elements are similar to those of the structure of the first embodiment shown in FIG. 11. Corresponding components have the same reference characters allotted, and their description will not be repeated.

The load and the like in the data transfer path is equalized in both the regular memory cell column side and the redundant memory cell column side according to the structure of FIG. 23 to allow improvement of the operation balance therebetween.

Third Embodiment

Figure 24:
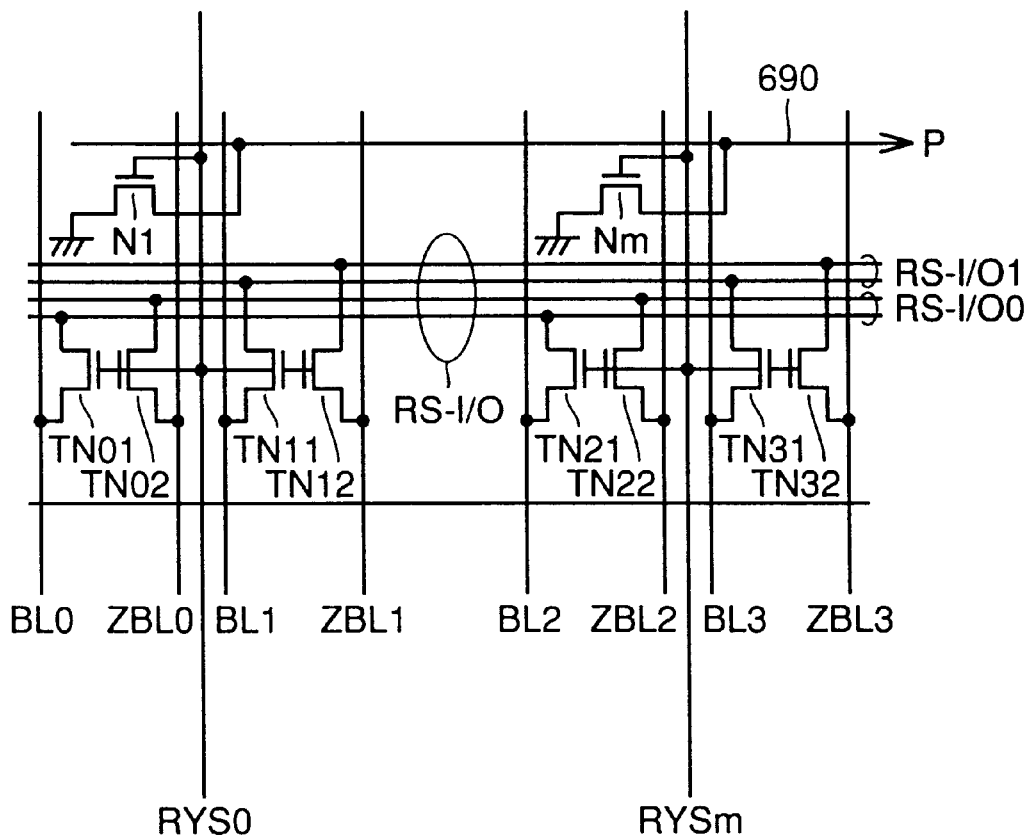
FIG. 24 is a circuit diagram showing a structure of a transfer gate portion according to a third embodiment of the present invention.

FIG. 24 is a circuit diagram showing a structure of a transfer gate portion to transmit data from a selected bit line pair to a sub I/O line pair RS-I/O in a redundant memory cell column region SR0 in a synchronous semiconductor memory device according to a third embodiment of the present invention. FIG. 24 is comparable to FIG. 13 of the first embodiment.

In FIG. 24, only the structure of the portion connected to two line pair RS-I/O corresponding to two memory cell columns by one column select line is illustrated.

In practice, four bit line pairs are connected to four corresponding sub I/O line pairs RS-I/O by the activation of one column select signal.

Referring to FIG. 24, activation of column select line RYS0 causes the pair of bit lines BL0 and ZBL0 to be connected to sub I/O line pair RS-I/O0 via transfer gate transistors TN01 and TN02, respectively.

In contrast, bit line pair BL1 and ZBL1 is connected to sub I/O line pair RS-I/O1 via transfer gate transistors TN11 and TN12, respectively, when column select line RYS0 is rendered active.

Line 690 (node P) is coupled to the ground potential via transistor N1 when column select line RYS0 is rendered active.

As will be described afterwards, line 690 supplies the ground potential of the subamplifier to transmit the data from sub I/O line pair RS-I/O0 and RS-I/O1 to a corresponding main I/O line pair.

Figure 25:
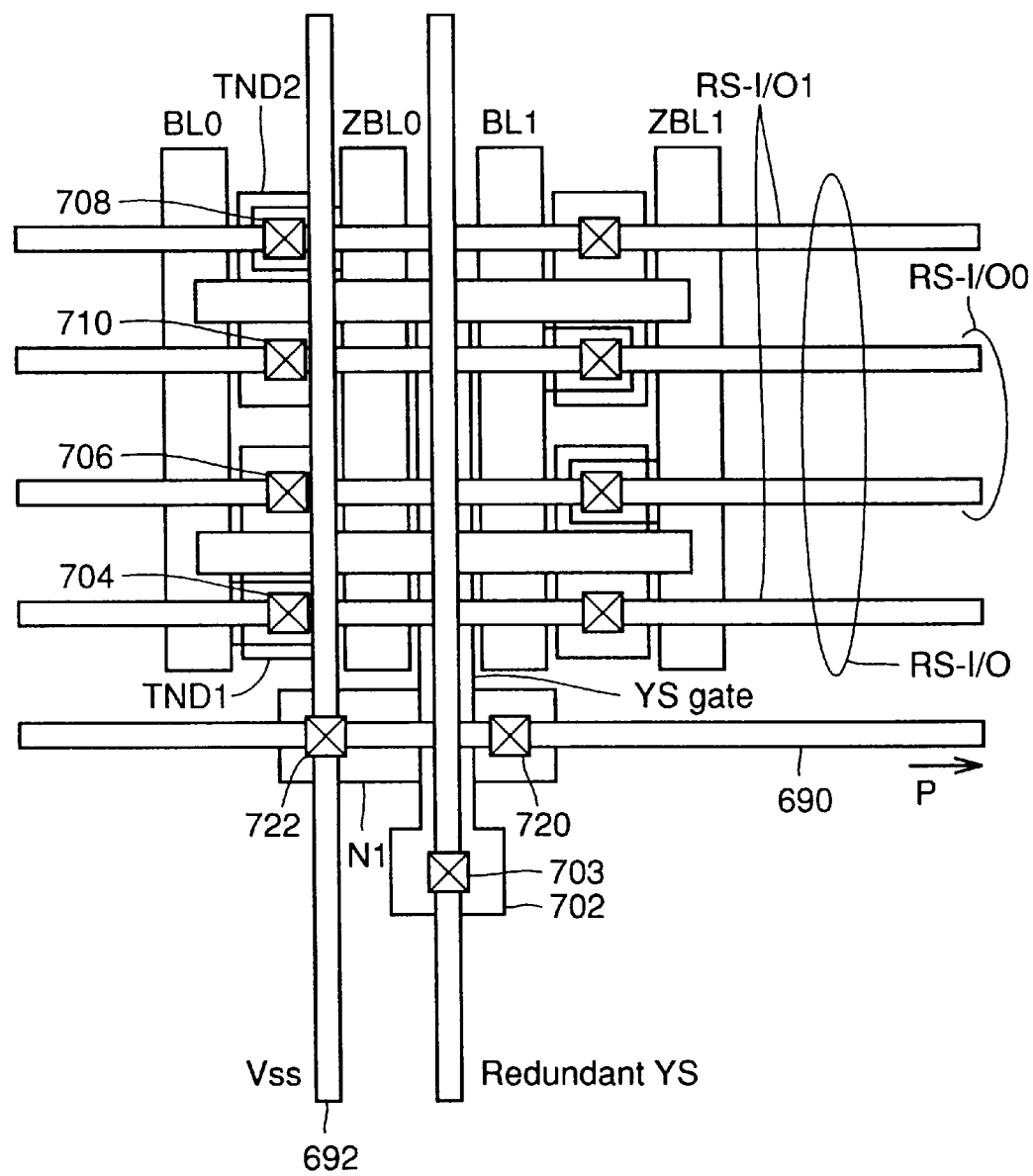
FIG. 25 shows an example of a plane pattern of a structure of a transfer gate of FIG. 24.

FIG. 25 shows an example of the plane pattern of the structure of FIG. 24.

The gates of transfer gate transistors TN01, TN02, TN11, TN12 and transistor N1 are formed by the same polysilicon layer 702.

Bit line BL0 is connected to the source region of transistor TN01 via a contact hole 704. The drain region of transfer gate transistor TN01 is connected to one I/O line of sub I/O line pair RS-I/O0 via a contact hole 706.

Bit line ZBL0 is connected to the source region of transfer gate transistor TN02 via contact hole 708. The drain region of transistor TN02 is connected to the other I/O line of sub I/O line pair RS-I/O0 via a contact hole 710.

Bit line pair BL1 and ZBL1 have a similar structure.

Transistor N1 has its source connected to a ground power supply line 692 via contact hole 722.

Line 690 is connected to the drain of transistor N1 via contact hole 720.

Polysilicon gate layer 702 is connected to column select line RYS0 via a contact hole 730.

By the above structure, the potential level of line 690 is pulled down to the ground potential simultaneous to the connection of the bit line pair and sub I/O line pair in response to activation of column select line YS0.

Figure 26:
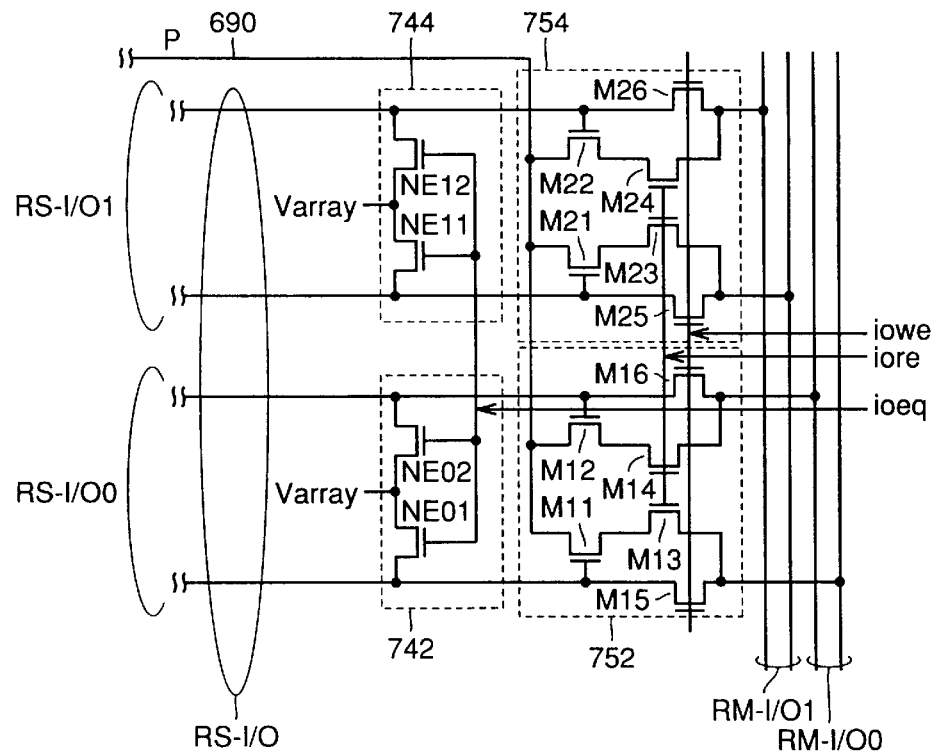
FIG. 26 is a circuit diagram showing a structure of equalize circuits 742 and 744, and subamplifiers 752 and 754.

FIG. 26 is a circuit diagram showing the structure of equalize circuits 742, 744 and subamplifiers 752 and 754 provided at the crossing between sub I/O line pairs RS-I/O0 and RS-I/O1 and corresponding main I/O line pairs RM-I/O0 and RM-I/O1.

Equalize circuit 742 and subamplifier 752 are provided corresponding to sub I/O line pair RS-I/O0. Equalize circuit 744 and subamplifier 754 are provided corresponding to sub I/O line pair RS-I/O1. Equalize circuit 742 includes N channel MOS transistors NE01 and NE02 connected in series between sub I/O line pair RS-I/O0, and rendered conductive by signal ioeq. Precharge potential Varray is supplied to the connection node of MOS transistors NE01 and NE02.

Subamplifier 752 includes N channel MOS transistors M11 and M12 having their respective sources connected to line 690, and respective gates connected to the I/O line of a corresponding sub I/O line pair, and N channel MOS transistors M13 and M14 connected between the drains of transistors M11 and M12 and the I/O line of corresponding I/O line pair RM-I/O0, and having a gate potential controlled by signal iore.

More specifically, when the potential of line 690 is pulled down to the level of the ground potential when transistors M13 and M14 are rendered conductive by signal iore, either of the potential level of main I/O line pair RM-I/O0 is pulled down to the level of the ground potential according to the potential level of sub I/O line pair RS-I/O0.

Thus, data transmitted through the sub I/O line pair in a readout operation is transmitted to a main I/O line pair.

Subamplifier 752 further includes transistors M15 and M16 connected between sub I/O line pair RS-I/O0 and main I/O line pair RM-I/O0, and having a gate potential controlled by signal iowe.

In a write operation, transistors M15 and M16 are both rendered conductive in response to activation of signal iowe, so that sub I/O line pair RS-I/O0 and main I/O line pair RM-I/O0 are connected directly.

According to the above structure, subamplifier 752 is rendered active in a readout operation only when the potential level of line 690 is pulled down to the level of the ground potential in response to activation of any column select line in the redundant memory cell column.

A similar structure is provided corresponding to sub I/O line pair RS-I/O1 and main I/O line pair RM-I/O1.

Since subamplifier 752 is rendered active only when replacement with a redundant column is carried out, power consumption can be reduced.

Fourth Embodiment

Figure 27:
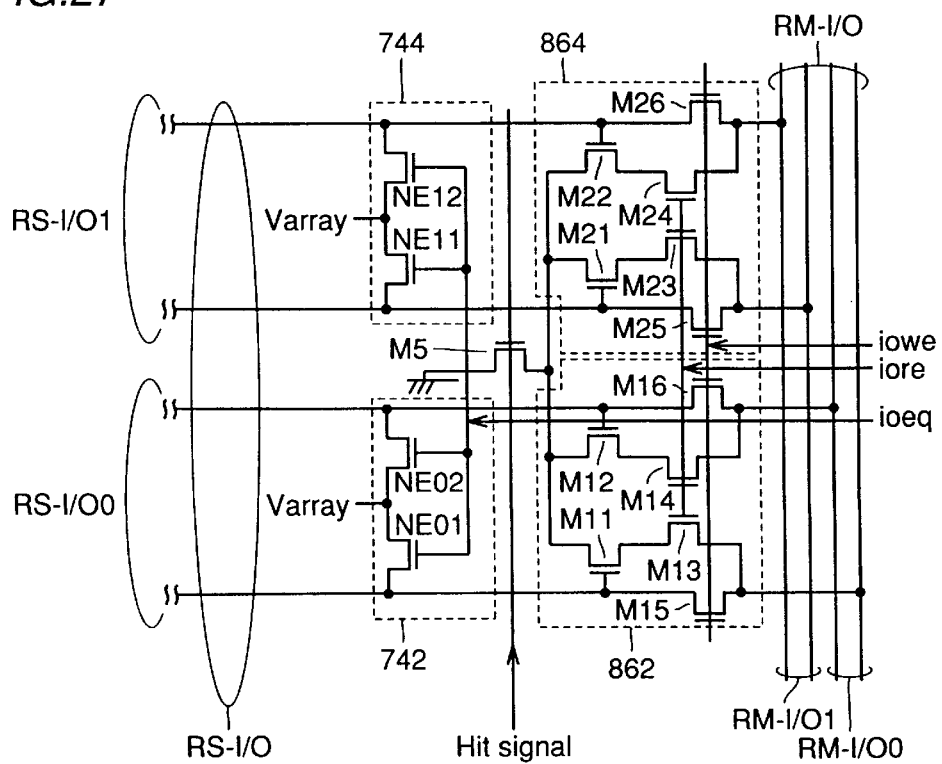
FIGS. 27 and 28 are circuit diagrams showing a structure of a subamplifier according to a fourth embodiment and a fifth embodiment, respectively, of the present invention.

FIG. 27 is a circuit diagram showing a structure of a subamplifier according to a fourth embodiment of the present invention. FIG. 27 is comparable to FIG. 26 showing a structure of the subamplifier of the third embodiment. The structure of subamplifiers 862 and 864 of the fourth embodiment differs from the structure of subamplifiers 852 and 854 in only the gate that supplies the ground potential to the subamplifier.

The remaining elements are similar to those of the structure of the subamplifier of the third embodiment. Corresponding components have the same reference characters allotted, and their description will not be repeated.

Subamplifiers 862 and 864 of the fourth embodiment are connected to the ground potential via N channel MOS transistor M5 having a gate potential controlled by signal Hit.

In the subamplifier of the fourth embodiment, subamplifiers 862 and 864 are rendered active only when replacement with the redundant memory cell column is carried out and signal Hit attains an active state (H level).

Since the subamplifier corresponding to the redundant memory cell column operates only during the period where replacement with a redundant column is carried out, power consumption can be reduced.

Fifth Embodiment

Figure 28:
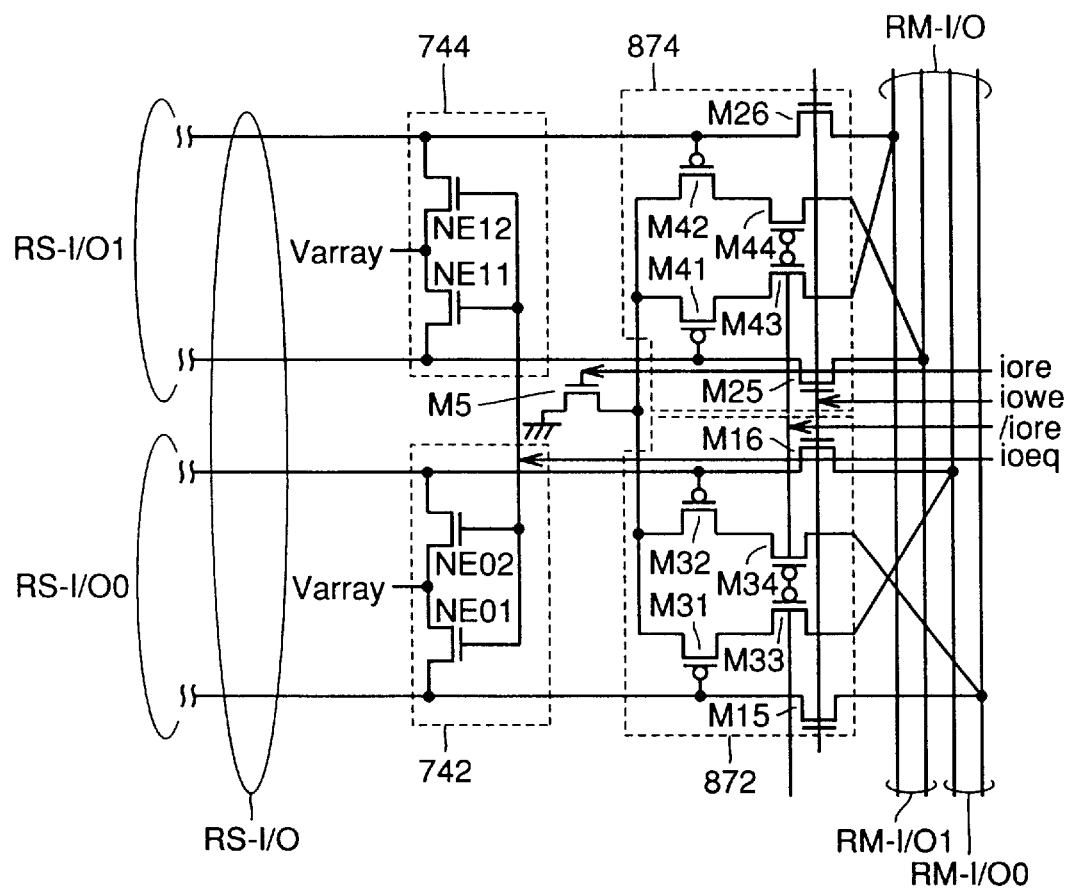

FIG. 28 is a circuit diagram showing a structure of subamplifiers 872 and 874 according to a fifth embodiment of the present invention.

The structure of subamplifiers 872 and 874 of FIG. 28 differs from the structure of the subamplifier of the fourth embodiment in the following points.

More specifically, in subamplifiers 872 and 874, transistors M31–M34 and M41–M44 are formed of P channel MOS transistors.

The gate potential of transistors M33, M34, M43 and M44 are controlled by a signal /iore which is an inverted version of signal iore. The gate of transistor M5 is controlled by signal iore.

The I/O lines of the main I/O line pair connected to transistors M33 and M34 and transistors M43 and M44 are opposite to those of transistors M13, M14, M23 and M24 of FIG. 27.

By such a structure, subamplifiers 872 and 864 carry out a charging operation only when one redundant column is selected and one potential of the sub I/O line pair RS-I/O of the redundant region attains an L level.

Since the subamplifier is rendered active only when replacement with a redundant column is carried out in the above structure, power consumption can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device receiving an address signal and a control signal in synchronization with an external clock signal, comprising:
   a memory cell array having a plurality of memory cells arranged in a matrix, said memory cell array including:
   a plurality of regular memory cell blocks; and
   a plurality of redundant memory cell blocks provided corresponding to every first plurality of said regular memory cell blocks, each for replacing a defective memory cell in the corresponding first plurality of regular memory cell blocks;
   an address bus provided common to said plurality of regular memory cell blocks and said redundant memory cell blocks to transmit said address signal;
   a plurality of first column select circuits provided corresponding to said regular memory cell blocks to select a memory cell column in a corresponding regular memory cell block according to said address signal from said address bus;
   a plurality of second column select circuits provided corresponding to said redundant memory cell blocks to select a memory cell column in a corresponding redundant memory cell block according to said address signal from said address bus,
   both of said first and second column select circuits being rendered active according to selection of said corresponding regular memory cell block and said corresponding redundant memory cell block on a basis of said address signal;
   a plurality of first input/output line pairs provided corresponding to said regular memory cell blocks to transmit data read out from a selected memory cell in a selected regular memory cell block;
   a plurality of second input/output line pairs provided corresponding to said redundant memory cell blocks to transmit data read out from a selected memory cell in a selected redundant memory cell block;
   a global data bus provided common to said plurality of regular memory cell blocks and said redundant memory cell blocks to transmit data to be output;
   a plurality of data transmitting circuits each selectively transmitting to said global data bus one of data from said corresponding regular memory cell block and said corresponding redundant memory cell block; and
   a plurality of judging circuits each controlling data selection of one of said data transmitting circuits according to which of said corresponding regular memory cell block and said corresponding redundant memory cell block is selected on a basis of preset defective address information.

2. A synchronous semiconductor memory device receiving externally applied address signal and column signal in synchronization with an external clock signal, comprising:
   a memory cell array having a plurality of memory cells arranged in a matrix, said memory cell array including:
   a plurality of regular memory cell blocks; and
   a plurality of redundant memory cell blocks provided corresponding to every first plurality of said regular memory cell blocks, each for replacing a defective memory cell in a corresponding said first plurality of regular memory cell blocks;
   an address bus provided common to said plurality of regular memory cell blocks and said redundant memory cell blocks to transmit said address signal, said address bus comprising:
   a first address bus transmitting a block select signal indicating which said memory cell block is to be selected; and
   a second address bus transmitting a cell address signal to select a memory cell in said memory cell block;
   a plurality of first column select circuits provided corresponding to said regular memory cell blocks to select a memory cell column in a corresponding regular memory cell block according to said address signal from said address bus;
   a plurality of second column select circuits provided corresponding to said redundant memory cell block to select a memory cell column in a corresponding redundant memory cell block according to said address signal from said address bus, said first and second column select circuits being rendered active according to selection of said corresponding regular memory cell block and said corresponding redundant memory cell block on a basis of said address signal respectively;

a plurality of first input/output line pairs provided corresponding to said regular memory cell blocks to transmit data read out from a selected memory cell in a corresponding regular memory cell block;

a plurality of second input/output line pairs provided corresponding to said redundant memory cell blocks to transmit data read out from a selected memory cell in a corresponding redundant memory cell block; and a plurality of address retain circuits provided corresponding to said memory cell blocks to receive and retain said cell address signal from said second address bus and provide the retained signal to said first and second column select circuits according to selection of a corresponding memory cell block by said block select signal.

3. The synchronous semiconductor memory device according to claim 2, wherein each said first column select circuit comprises a first decode circuit receiving an output from said address retain circuit to decode said cell address signal, and a first column decoder receiving a decoded result from said first decode circuit to select a memory cell column in a corresponding regular memory cell block, wherein each said second column select circuit comprises a second decode circuit receiving an output from said address retain circuit to decode said cell address signal, and a second column decoder receiving a decoded result from said second decode circuit to select a memory cell column in a corresponding redundant memory cell block.

4. The synchronous semiconductor memory device according to claim 3, wherein said first input/output line pair comprises a plurality of first sub input/output line pairs provided in a row direction of said memory cell array, and a plurality of first main input/output line pairs provided in a column direction of said memory cell array, wherein said second input/output line pair comprises a plurality of second sub input/output line pairs provided in a row direction of said memory cell array, and a plurality of second main input/output line pairs provided in a column direction of said memory cell array, said synchronous semiconductor memory device further comprising:

a plurality of first main amplifier circuits provided corresponding to said plurality of first main input/output line pairs, respectively; and a plurality of second main amplifier circuits provided corresponding to said plurality of second main input/output line pairs, respectively;

wherein each said second column select circuit comprises a main amplifier control signal generation circuit controlling activation of said first and second main amplifier circuits according to whether a memory cell column in said corresponding redundant memory cell block is selected or not on a basis of preset defective address information.

5. A synchronous semiconductor memory device receiving externally applied address signal and column signal in synchronization with an external clock signal, comprising:

a memory cell array having a plurality of memory cells arranged in a matrix, said memory cell array including:

a plurality of regular memory cell blocks; and a plurality of redundant memory cell blocks provided corresponding to every first plurality of said regular memory cell blocks, each for replacing a defective memory cell in a corresponding said first plurality of regular memory cell blocks;

an address bus provided common to said plurality of regular memory cell blocks and said redundant memory cell blocks to transmit said address signal;

a plurality of first column select circuits provided corresponding to said regular memory cell blocks to select a memory cell column in a corresponding regular memory cell block according to said address signal from said address bus;

a plurality of second column select circuits provided corresponding to said redundant memory cell block to select a memory cell column in a corresponding redundant memory cell block according to said address signal from said address bus, said first and second column select circuits being rendered active according to selection of said corresponding regular memory cell block and said corresponding redundant memory cell block on a basis of said address signal respectively;

a plurality of first input/output line pairs provided corresponding to said regular memory cell blocks to transmit data read out from a selected memory cell in a corresponding regular memory cell block, wherein said first input/output line pair comprises:

a second plurality of first sub input/output line pairs provided in a row direction of said memory cell array, and a plurality of first main input/output line pairs provided in a column direction of said memory cell array;

a plurality of second input/output line pairs provided corresponding to said redundant memory cell blocks to transmit data read out from a selected memory cell in a corresponding redundant memory cell block, wherein said input/output line pairs comprises:

a second plurality of second sub input/output line pairs provided in the row direction of said memory cell array, and a plurality of second main input/output line pairs provided in the column direction of said memory cell array;

a plurality of subamplifier circuits provided corresponding to a crossing of said first sub input/output line pair and aid first main input/output line pair;

a plurality of second subamplifier circuits provided corresponding to a crossing of said second sub input/output line pair and said second main input/output line pair; and a plurality of subamplifier control signal lines provided in common to said first subamplifier circuit and said second subamplifier circuit in the row direction of said memory cell array to transmit a subamplifier elect signal.

6. The synchronous semiconductor memory device according to claim 5, wherein each said subamplifier control signal line is shared by two of said second subamplifier circuits provided corresponding to the same one redundant memory cell block.

7. The synchronous semiconductor memory device according to claim 5, further comprising a subamplifier activation circuit for rendering said second subamplifier circuit active according to replacement of a memory cell in said regular memory cell block with a memory cell in said redundant memory cell block.

8. The synchronous semiconductor memory device according to claim 7, wherein
   said memory cell array includes a plurality of bit line pairs provided corresponding to a memory cell column,
   each said second column select circuit includes a column select line activated according to selection of a redundant memory cell column in a corresponding redundant memory cell block,
   said subamplifier activation signal includes
      a power supply line provided corresponding to said second subamplifier to transmit a power supply potential, and
      a first switch circuit coupling said power supply line and said power supply potential according to activation of said column select line.

9. The synchronous semiconductor memory device according to claim 7, wherein each said second column select circuit includes a determination circuit to determine whether a memory cell column in said corresponding redundant memory cell block is to be selected or not according to preset defective address information,
   wherein said subamplifier activation signal includes a second switch circuit provided corresponding to said second subamplifier, coupling a corresponding second subamplifier and a power supply potential according to a determination result of said determination circuit.

10. A synchronous semiconductor memory device receiving externally applied address signal and column signal in synchronization with an external clock signal, comprising:
   a memory cell array having a plurality of memory cells arranged in a matrix, said memory cell array including:
      a plurality of regular memory cell blocks; and
      a plurality of redundant memory cell blocks provided corresponding to every first plurality of said regular memory cell blocks, each for replacing a defective memory cell in a corresponding said first plurality of regular memory cell blocks;
      an address bus provided common to said plurality of regular memory cell blocks and said redundant memory cell blocks to transmit said address signal;
   a plurality of first column select circuits provided corresponding to said regular memory cell blocks to select a memory cell column in a corresponding regular memory cell block according to said address signal from said address bus;
   a plurality of second column select circuits provided corresponding to said redundant memory cell block to select a memory cell column in a corresponding redundant memory cell block according to said address signal from said address bus, said first and second column select circuits being rendered active according to selection of said corresponding regular memory cell block and said corresponding redundant memory cell block on a basis of said address signal respectively;
   a plurality of first input/output line pairs provided corresponding to said regular memory cell blocks to transmit data read out from a selected memory cell in a corresponding regular memory cell block, wherein said first input/output line pair comprises:
      a second plurality of first sub input/output line pairs provided in a row direction of said memory cell array, and
      a plurality of first main input/output line pairs provided in a column direction of said memory cell array;
   a plurality of second input/output line pairs provided corresponding to said redundant memory cell blocks to transmit data read out from a selected memory cell in a corresponding redundant memory cell block, wherein said input/output line pairs comprises:
      a second plurality of second sub input/output line pairs provided in the row direction of said memory cell array, and
      a plurality of second main input/output line pairs provided in the column direction of said memory cell array;
   a plurality of first main amplifier circuits provided corresponding to said first plurality of first main input/output line pairs, respectively; and
   a plurality of second main amplifier circuits provided corresponding to said plurality of second main input/output line pairs, respectively,
   wherein each said second column select circuit comprises a main amplifier control signal generation circuit controlling activation of said first and second main amplifier circuits according to whether a memory cell column in said corresponding redundant memory cell block is to be selected or not according to preset defective address information.

11. A synchronous semiconductor memory device receiving externally applied address signal and column signal in synchronization with an external clock signal, comprising:
   a memory cell array having a plurality of memory cells arranged in a matrix, said memory cell array including:
      a plurality of regular memory cell blocks; and
      a plurality of redundant memory cell blocks provided corresponding to every first plurality of said regular memory cell blocks, each for replacing a defective memory cell in a corresponding said first plurality of regular memory cell blocks;
      an address bus provided common to said plurality of regular memory cell blocks and said redundant memory cell blocks to transmit said address signal;
   a plurality of first column select circuits provided corresponding to said regular memory cell blocks to select a memory cell column in a corresponding regular memory cell block according to said address signal from said address bus;
   a plurality of second column select circuits provided corresponding to said redundant memory cell block to select a memory cell column in a corresponding redundant memory cell block according to said address signal from said address bus, said first and second column select circuits being rendered active according to selection of said corresponding regular memory cell block and said corresponding redundant memory cell block on a basis of said address signal respectively;
   a plurality of first input/output line pairs provided corresponding to said regular memory cell blocks to transmit data read out from a selected memory cell in a corresponding regular memory cell block, wherein said first input/output line pair comprises:
      a second plurality of first sub input/output line pairs provided in a row direction of said memory cell array, and
      a plurality of first main input/output line pairs provided in a column direction of said memory cell array;
   a plurality of second input/output line pairs provided corresponding to said redundant memory cell blocks to transmit data read out from a selected memory cell in a corresponding redundant memory cell block, wherein said input/output line pairs comprises:

a plurality of second sub input/output line pairs provided in the row direction of said memory cell array, and a plurality of second main input/output line pairs provided in the column direction of said memory cell array;

a plurality of first main amplifier circuits provided corresponding to said plurality of first main input/output line pairs, respectively;

a plurality of second main amplifier circuits provided corresponding to said plurality of second main input/output line pairs, respectively;

a data bus provided in common to said plurality of regular memory cell blocks and said redundant memory cell block to transmit said readout data, wherein said data bus includes a plurality of data line pairs; and a first multiplexer circuit provided corresponding to said redundant memory cell block to selective transmit the output of said second main amplifier circuit to any of the plurality of data line pairs transmitting data read out from said first plurality of regular memory cell blocks that can be replaced with a corresponding redundant memory cell block.

12. The synchronous semiconductor memory device according to claim 11, further comprising a second multiplexer circuit provided corresponding to said regular memory cell block to selectively transmit the output of said first main amplifier circuit to any of the plurality of data line pairs transmitting data read out from a corresponding regular memory cell block.

* * * * *